US010573789B2

(12) United States Patent
Ichikawa et al.

(10) Patent No.: US 10,573,789 B2
(45) Date of Patent: Feb. 25, 2020

(54) LIGHT EMITTING DEVICE, RESIN PACKAGE, RESIN-MOLDED BODY, AND METHODS FOR MANUFACTURING LIGHT EMITTING DEVICE, RESIN PACKAGE AND RESIN-MOLDED BODY

(71) Applicant: NICHIA CORPORATION, Anan-shi, Tokushima (JP)

(72) Inventors: Hirofumi Ichikawa, Komatsushima (JP); Masaki Hayashi, Anan (JP); Shimpei Sasaoka, Tokushima (JP); Tomohide Miki, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/150,255

(22) Filed: Oct. 2, 2018

(65) Prior Publication Data

US 2019/0088825 A1    Mar. 21, 2019

Related U.S. Application Data

(63) Continuation of application No. 15/360,316, filed on Nov. 23, 2016, now Pat. No. 10,115,870, which is a
(Continued)

(30) Foreign Application Priority Data

Sep. 3, 2008    (JP) ................ 2008-225408

(51) Int. Cl.
*H01L 33/58* (2010.01)
*H01L 33/48* (2010.01)
(Continued)

(52) U.S. Cl.
CPC ........ *H01L 33/486* (2013.01); *B29C 45/0055* (2013.01); *B29C 45/14655* (2013.01);
(Continued)

(58) Field of Classification Search
CPC ... H01L 25/0753; H01L 33/62; H01L 33/485; H01L 33/58; H01L 33/507;
(Continued)

(56) References Cited

U.S. PATENT DOCUMENTS 5,302,849 A    4/1994 Cavasin
5,428,248 A    6/1995 Cha
(Continued)

FOREIGN PATENT DOCUMENTS

EP    0 936 683 A1    8/1999
EP    2 100 908 A1    9/2009
(Continued)

OTHER PUBLICATIONS

Machine Translation of Urasaki , JP2006-140207A (Jun. 1, 2006).*
(Continued)

*Primary Examiner* — Caridad Everhart
(74) *Attorney, Agent, or Firm* — Foley & Lardner LLP

(57) ABSTRACT

A method of manufacturing a light emitting device having a resin package which provides an optical reflectivity equal to or more than 70% at a wavelength between 350 nm and 800 nm after thermal curing, and in which a resin part and a lead are formed in a substantially same plane in an outer side surface, includes a step of sandwiching a lead frame provided with a notch part, by means or an upper mold and a lower mold, a step of transfer-molding a thermosetting resin containing a light reflecting material in a mold sandwiched by the upper mold and the lower mold to form a resin-molded body in the lead frame and a step of cutting the resin-molded body and the lead frame along the notch part.

21 Claims, 13 Drawing Sheets

Related U.S. Application Data continuation of application No. 14/928,550, filed on Oct. 30, 2015, now Pat. No. 9,537,071, which is a continuation of application No. 13/969,182, filed on Aug. 16, 2013, now Pat. No. 9,287,476, which is a continuation of application No. 12/737,940, filed as application No. PCT/JP2009/004170 on Aug. 27, 2009, now Pat. No. 8,530,250.

(51) Int. Cl.

| | | |
|---|---|---|
| *B29C 45/00* | (2006.01) | |
| *B29C 45/14* | (2006.01) | |
| *H01L 33/60* | (2010.01) | |
| *H01L 23/00* | (2006.01) | |
| *H01L 33/00* | (2010.01) | |
| *H01L 33/62* | (2010.01) | |
| *H01L 33/64* | (2010.01) | |
| *H01L 33/50* | (2010.01) | |
| *H01L 33/56* | (2010.01) | |

(52) U.S. Cl.
CPC .......... *H01L 24/97* (2013.01); *H01L 33/0095* (2013.01); *H01L 33/504* (2013.01); *H01L 33/56* (2013.01); *H01L 33/60* (2013.01); *H01L 33/62* (2013.01); *H01L 33/641* (2013.01); *B29C 2793/009* (2013.01); *H01L 2224/48091* (2013.01); *H01L 2224/48247* (2013.01); *H01L 2224/48257* (2013.01); *H01L 2924/00012* (2013.01); *H01L 2924/12035* (2013.01); *H01L 2924/12041* (2013.01); *H01L 2924/12042* (2013.01); *H01L 2924/181* (2013.01); *H01L 2924/3025* (2013.01); *H01L 2933/0033* (2013.01); *H01L 2933/0066* (2013.01)

(58) Field of Classification Search
CPC ..... H01L 2933/0066; H01L 2933/0058; H01L 2224/49113; H01L 2224/48137; H01L 21/56; H01L 2924/00014; H01L 2924/181; H01L 33/38; H01L 33/52; H01L 33/505
See application file for complete search history.

(56) References Cited

U.S. PATENT DOCUMENTS

| | | | |
|---|---|---|---|
| 5,763,829 A | 6/1998 | Tomita et al. | |
| 5,818,105 A | 10/1998 | Kouda | |
| 6,107,646 A | 8/2000 | Kim | |
| 6,107,676 A | 8/2000 | Suzuki | |
| 6,184,544 B1 | 2/2001 | Toda et al. | |
| 6,252,254 B1 | 6/2001 | Soules et al. | |
| 6,274,890 B1 | 8/2001 | Oshio et al. | |
| 6,320,251 B1* | 11/2001 | Glenn ................. | H01L 23/3107 257/678 |
| 6,333,564 B1 | 12/2001 | Katoh et al. | |
| 6,335,545 B1 | 1/2002 | Toda et al. | |
| 6,424,024 B1 | 7/2002 | Shih et al. | |
| 6,433,277 B1 | 8/2002 | Glenn | |
| 6,498,099 B1 | 12/2002 | McLellan et al. | |
| 6,518,508 B2 | 2/2003 | Park et al. | |
| 6,531,370 B2 | 3/2003 | Sakamoto et al. | |
| 6,624,007 B2 | 9/2003 | Kobayakawa et al. | |
| 6,627,482 B2 | 9/2003 | Wang et al. | |
| 6,638,780 B2 | 10/2003 | Fukasawa et al. | |
| 6,770,498 B2 | 8/2004 | Hsu | |
| 6,777,719 B1 | 8/2004 | Fujii | |
| 6,791,259 B1 | 9/2004 | Stokes et al. | |
| 6,853,057 B2 | 2/2005 | Yasuda et al. | |
| 6,914,267 B2 | 7/2005 | Fukasawa et al. | |
| 6,978,079 B2 | 12/2005 | Uwada et al. | |
| 7,161,190 B2 | 1/2007 | Chikugawa | |
| 7,301,176 B2 | 11/2007 | Abe et al. | |
| 7,332,375 B1* | 2/2008 | Glenn ................. | H01L 23/49541 257/E21.502 |
| 7,364,947 B2 | 4/2008 | Kobayakawa | |
| 7,407,834 B2 | 8/2008 | Shimanuki et al. | |
| 7,687,292 B2 | 3/2010 | Park et al. | |
| 7,799,611 B2 | 9/2010 | Ramos et al. | |
| 8,093,619 B2 | 1/2012 | Hayashi | |
| 8,637,892 B2 | 1/2014 | Egoshi et al. | |
| 9,490,411 B2 | 11/2016 | Ichikawa et al. | |
| 9,537,071 B2 | 1/2017 | Ichikawa et al. | |
| 2001/0009301 A1 | 7/2001 | Azuma | |
| 2002/0005573 A1 | 1/2002 | Maeda | |
| 2002/0028525 A1 | 3/2002 | Sakamoto et al. | |
| 2002/0110951 A1 | 8/2002 | Wang et al. | |
| 2002/0140092 A1 | 10/2002 | Nakanishi et al. | |
| 2002/0185649 A1 | 12/2002 | Oshio | |
| 2003/0006492 A1 | 1/2003 | Ogasawara et al. | |
| 2003/0107316 A1 | 6/2003 | Murakami et al. | |
| 2004/0000727 A1 | 1/2004 | Hsu | |
| 2004/0046242 A1 | 3/2004 | Asakawa | |
| 2004/0051171 A1 | 3/2004 | Ng et al. | |
| 2004/0066933 A1 | 4/2004 | Jeffery et al. | |
| 2004/0075100 A1 | 4/2004 | Bogner et al. | |
| 2004/0106234 A1 | 6/2004 | Sorg et al. | |
| 2004/0126913 A1 | 7/2004 | Loh | |
| 2004/0130907 A1 | 7/2004 | Albou | |
| 2004/0159850 A1 | 8/2004 | Takenaka | |
| 2005/0093116 A1 | 5/2005 | Palmteer et al. | |
| 2005/0133808 A1* | 6/2005 | Uraya ................. | H01L 33/486 257/99 |
| 2005/0151149 A1 | 7/2005 | Chia et al. | |
| 2005/0211991 A1 | 9/2005 | Mori et al. | |
| 2005/0245018 A1 | 11/2005 | Bogner et al. | |
| 2005/0269587 A1 | 12/2005 | Loh et al. | |
| 2005/0277216 A1 | 12/2005 | Asakawa | |
| 2005/0280017 A1 | 12/2005 | Oshio et al. | |
| 2006/0054912 A1 | 3/2006 | Murakami et al. | |
| 2006/0170083 A1 | 8/2006 | Kim et al. | |
| 2006/0249746 A1* | 11/2006 | Oshio ................. | H01L 25/0753 257/99 |
| 2006/0267036 A1 | 11/2006 | Lee et al. | |
| 2006/0284207 A1 | 12/2006 | Park et al. | |
| 2007/0126020 A1 | 6/2007 | Lin et al. | |
| 2007/0138697 A1 | 6/2007 | Takeda et al. | |
| 2007/0215892 A1 | 9/2007 | Ishii et al. | |
| 2007/0241357 A1 | 10/2007 | Yan | |
| 2007/0241362 A1 | 10/2007 | Han et al. | |
| 2007/0246729 A1 | 10/2007 | Park | |
| 2008/0012036 A1 | 1/2008 | Loh et al. | |
| 2008/0044934 A1 | 2/2008 | Loh et al. | |
| 2008/0059856 A1 | 3/2008 | Lee et al. | |
| 2008/0073662 A1 | 3/2008 | Wang et al. | |
| 2008/0079019 A1 | 4/2008 | Huang et al. | |
| 2008/0128723 A1* | 6/2008 | Pang ................... | H01L 33/486 257/98 |
| 2008/0157113 A1 | 7/2008 | Hayashi | |
| 2008/0224161 A1 | 9/2008 | Takada | |
| 2008/0255283 A1 | 10/2008 | Aoki et al. | |
| 2008/0258156 A1 | 10/2008 | Hata | |
| 2008/0258162 A1 | 10/2008 | Koung et al. | |
| 2008/0261339 A1 | 10/2008 | Koung et al. | |
| 2009/0050925 A1 | 2/2009 | Kuramoto et al. | |
| 2009/0057708 A1 | 3/2009 | Abdul Karim et al. | |
| 2009/0118440 A1* | 5/2009 | Nakanishi ............ | C08L 83/04 525/478 |
| 2009/0236625 A1 | 9/2009 | Yen et al. | |
| 2009/0289275 A1 | 11/2009 | Hayashi | |
| 2009/0315049 A1 | 12/2009 | Urasaki et al. | |
| 2010/0038662 A1 | 2/2010 | Fushimi et al. | |
| 2010/0140638 A1 | 6/2010 | Kotani et al. | |
| 2010/0150638 A1 | 6/2010 | Namiki et al. | |
| 2010/0155739 A1 | 6/2010 | Kuramoto et al. | |
| 2010/0187546 A1 | 7/2010 | Fushimi et al. | |
| 2010/0314654 A1 | 12/2010 | Hayashi | |
| 2011/0210354 A1 | 9/2011 | Ichikawa et al. | |
| 2012/0037939 A1 | 2/2012 | Urano | |
| 2012/0295374 A1 | 11/2012 | Hayashi | |

(56) References Cited

U.S. PATENT DOCUMENTS

| | | | |
|---|---|---|---|
| 2013/0187191 | A1 | 7/2013 | Takada |
| 2014/0084320 | A1 | 3/2014 | Ichikawa et al. |
| 2014/0306262 | A1 | 10/2014 | Hayashi |
| 2015/0054022 | A1 | 2/2015 | Takada |
| 2016/0049566 | A1 | 2/2016 | Ichikawa et al. |
| 2016/0056357 | A1 | 2/2016 | Ichikawa et al. |
| 2017/0141273 | A1 | 5/2017 | Ichikawa et al. |

FOREIGN PATENT DOCUMENTS

| | | | | | |
|---|---|---|---|---|---|
| JP | 54-069068 | A | | 6/1979 | |
| JP | S60-262476 | A | | 12/1985 | |
| JP | H07-099345 | | | 4/1995 | |
| JP | 08-037252 | | | 2/1996 | |
| JP | 11-045958 | | | 2/1999 | |
| JP | 11-087780 | | | 3/1999 | |
| JP | H11-145523 | A | | 5/1999 | |
| JP | 11-163007 | A | | 6/1999 | |
| JP | 11-191562 | A | | 7/1999 | |
| JP | 11-214754 | | | 8/1999 | |
| JP | H11-307820 | A | | 11/1999 | |
| JP | 2000-156435 | A | | 6/2000 | |
| JP | 2000-174347 | A | | 6/2000 | |
| JP | 2001-015668 | A | | 1/2001 | |
| JP | 2001-036154 | | | 2/2001 | |
| JP | 2001-077160 | A | | 3/2001 | |
| JP | 2001-077235 | A | | 3/2001 | |
| JP | 2001-267482 | A | | 9/2001 | |
| JP | 2001-326295 | A | | 11/2001 | |
| JP | 2002-314138 | A | | 10/2002 | |
| JP | 2003-037236 | A | | 2/2003 | |
| JP | 2003-110145 | A | | 4/2003 | |
| JP | 2003-152296 | | | 5/2003 | |
| JP | 2003-174200 | A | | 6/2003 | |
| JP | 2003-218398 | A | | 7/2003 | |
| JP | 2003-304000 | A | | 10/2003 | |
| JP | 2004-111964 | A | | 4/2004 | |
| JP | 2004-274027 | A | | 9/2004 | |
| JP | 2004-335740 | A | | 11/2004 | |
| JP | 2005-507178 | A | | 3/2005 | |
| JP | 2005-243857 | A | | 9/2005 | |
| JP | 2005-306952 | A | | 11/2005 | |
| JP | 2005-311137 | A | | 11/2005 | |
| JP | 2005-535135 | A | | 11/2005 | |
| JP | 2005-535135 | W | | 11/2005 | |
| JP | 2006-060034 | A | | 3/2006 | |
| JP | 2006-093697 | A | | 4/2006 | |
| JP | 2006-140207 | A | | 6/2006 | |
| JP | 2006-156704 | A | | 6/2006 | |
| JP | 2006140207 | | * | 6/2006 | ... H03L 2924/00014 |
| JP | 2006-278427 | A | | 10/2006 | |
| JP | 2006-313943 | A | | 11/2006 | |
| JP | 2006-324410 | A | | 11/2006 | |
| JP | 2006-339639 | A | | 12/2006 | |
| JP | 2007-005722 | A | | 1/2007 | |
| JP | 2007-035794 | A | | 2/2007 | |
| JP | 2007-123302 | A | | 5/2007 | |
| JP | 2007-180591 | | | 7/2007 | |
| JP | 2007-235085 | A | | 9/2007 | |
| JP | 2007235085 | | * | 9/2007 | ............ H01L 24/97 |
| JP | 2007-294506 | A | | 11/2007 | |
| JP | 2007-297601 | A | | 11/2007 | |
| JP | 2007-329502 | A | | 12/2007 | |
| JP | 2008-103460 | A | | 5/2008 | |
| JP | 2008-106226 | A | | 5/2008 | |
| JP | 2008-108958 | A1 | | 5/2008 | |
| JP | 2008-130735 | A | | 6/2008 | |
| JP | 2008-166535 | A | | 7/2008 | |
| JP | 2008-186891 | A | | 8/2008 | |
| JP | 2008-192880 | A | | 8/2008 | |
| JP | 2008-140944 | A | | 9/2008 | |
| JP | 2008-227166 | A | | 9/2008 | |
| JP | 2009-283883 | A | | 12/2009 | |
| JP | 2010-021259 | A | | 1/2010 | |
| JP | 2010-062272 | A | | 3/2010 | |
| JP | 2013-145908 | A | | 7/2013 | |
| JP | 2013-153182 | A | | 8/2013 | |
| TW | 2006-19780 | A | | 6/2006 | |
| TW | 2007-42138 | A | | 11/2007 | |
| WO | WO-2004/015769 | A1 | | 2/2004 | |
| WO | WO-2006/126438 | | | 11/2006 | |
| WO | WO-2007/015426 | A1 | | 2/2007 | |
| WO | WO-2007/055486 | A1 | | 5/2007 | |
| WO | WO-2007/135707 | | | 11/2007 | |
| WO | WO-2008/056813 | A1 | | 5/2008 | |
| WO | WO-2008/059856 | | | 5/2008 | |
| WO | WO-2008/081696 | A1 | | 7/2008 | |
| WO | WO-2008/081794 | A1 | | 7/2008 | |
| WO | WO-2008-078791 | A1 | | 4/2010 | |

OTHER PUBLICATIONS

Machine Translation of Urasaki, JP2007-235085 A (Sep. 13, 2007).*
Declaration of Dr. Stanley R. Shanfield in Support of Petitioner's Reply and Opposition to Patent Owner's Contingent Motion to Amend Claims, *Vizio Inc v Nichia Corporation*, Case No. IPR2018-00437.
IEEE Standard Glossary of Computer Hardware Terminology, IEEE Std 610.10-1994, Oct. 12, 1995.
Non-Final Office Action in U.S. Appl. No. 16/007,954 dated May 13, 2019.
Non-Final Office Action in U.S. Appl. No. 16/150,259 dated May 15, 2019.
Declaration of Dr. Stanley R. Shanfield (IPR2018-00601).
Declaration of Dr. Stanley R. Shanfield for Inter Partes Review of U.S. Pat. No. 8,530,250 (2017-02011).
Declaration of Dr. Stanley R. Shanfield for Inter Partes Review of U.S. Pat. No. 8,530,250 (2017-02014).
Declaration of Dr. Stanley R. Shanfield for Inter Partes Review of U.S. Pat. No. 9,490,411 (2018-00386).
Declaration of Dr. Stanley R. Shanfield for Inter Partes Review of U.S. Pat. No. 9,537,071 (2018-00437).
Declaration of Dr. Stanley R. Shanfield in support of Petition for Inter Partes Review of U.S. Pat. No. 8,530,250. (IPR 2017-01623).
Declaration of Dr. Stanley R. Shanfield in support of Petition for Inter Partes Review of U.S. Pat. No. 8,530,250.(IPR 2017-01608).
EP Communication for application No. 09877246.9 dated Nov. 25, 2013 with attached Supplementary European Search Report for EP 09 81 1246 dated Oct. 31, 2013.
European Patent Office, Third Party Observation Concerning EP09811246.9 dated Aug. 1, 2013.
Extended European Search Report for EP Application No. 09 811 246.9-1226 dated Nov. 25, 2013 submitted by Eisenfuhr Speiser in a letter dated Dec. 10, 2013.
File History of U.S. Pat. No. 9,537,071.
File history of U.S. Pat. No. 8,530,250.
File History of U.S. Pat. No. 9,490,411.
International Search Report in PCT/JP2009/004170 dated Nov. 24, 2009.
Moichiro Wakabayashi, "Titanium Oxide Pigments", Nippon Gomu Kyokaishi, vol. 36 (1963), Issue 3, pp. 310-317 with its partial English translation.
*Nichia Corp. v. Everlight Ams. Inc.*, Nos. 2016-1585, 2016-1618, D.I. 52, Opinion and Judgment (Fed. Cir. Apr. 28, 2017).
*Nichia Corp. v. Everlight Elecs. Co.*, No. 2:13-CV-702-JRG, D.I. 79, Claim Construction Memorandum Opinion and Oder (E.D. Tex. Dec. 12, 2014).
*Nichia Corp. v. Vizio, Inc.*, No. 2:16-cv-01453-JRG, D.I.152, Plaintiff Nichia Corporation$2019s P.R. 4-5(a) Opening Claim Construction Brief (E.D. Tex. Nov. 22, 2017).
*Nichia Corp. v. Vizio, Inc.*, No. 2:16-cv-01453-JRG, D.I.186, Defendants$2019 Responsive Claim Construction Brief (E.D. Tex. Dec. 13, 2017).
*Nichia Corp. v. Vizio, Inc.*, No. 2:16-cv-01453-JRG, D.I.211, Joint Claim Construction Chart P.R. 4-5(D) (E.D. Tex. Jan. 8, 2018).
Non-Final Office Action U.S. Appl. No. 12/737,940 dated Sep. 28, 2012.

(56) References Cited

OTHER PUBLICATIONS

Notice of Allowance dated Jul. 9, 2015 issued in U.S. Appl. No. 13/969,182.
Notice of Allowance on U.S. Appl. No. 15/360,316 dated Jun. 15, 2018.
Notice of Allowance U.S. Appl. No. 12/737,940 dated May 13, 2013.
Office Action dated Dec. 4, 2014 issued in U.S. Appl. No. 13/969,182.
Office Action dated Mar. 5, 2014 issued in U.S. Appl. No. 13/969,182.
Office Action issued in corresponding U.S. Appl. No. 14/928,570 dated Jan. 4, 2016.
Office Action issued in Japanese Patent Application No. 2015-200794 dated Sep. 13, 2016.
Petition for Inter Partes Review of U.S. Pat. No. 8,530,250 (IPR2017-01608).
Petition for Inter Partes Review of U.S. Pat. No. 8,530,250 (IPR2017-01623).
Supplemental Notice of Allowability issued in U.S. Appl. No. 14/928,550 dated Oct. 13, 2016.
Translation of JP 2007-235085-A (Urasaki) Sep. 13, 2007, 16 pages.
Translation of JP2007-297601A (Yuasa et al, Hitachi Chemical Co. Ltd.), Mar. 2007, 17 pages.
U.S. Notice of Allowance on 100415-0134 dated Oct. 30, 2015.
U.S. Notice of Allowance on U.S. Appl. No. 14/928,570 dated Oct. 12, 2016.
U.S. Office Action on 100415-0104 dated Sep. 28, 2012.
U.S. Office Action on U.S. Appl. No. 14/928,550 dated Dec. 31, 2015.
U.S. Office Action on U.S. Appl. No. 14/928,570 dated Jan. 4, 2016.
U.S. Office Action on U.S. Appl. No. 15/360,316 dated Nov. 6, 2017.
Written Opinion of the International Searching Authority in PCT/JP2009/004170 dated Nov. 24, 2009.
Written Opinion of the Internationl Searching Authority in PCT/JP2009/004170 dated Nov. 24, 2009.
Non-Final Office Action of corresponding U.S. Appl. No. 16/150,259 dated Sep. 30, 2019.
Notice of Allowance of corresponding U.S. Appl. No. 16/007,954 dated Oct. 10, 2019.

\* cited by examiner (a)

(b)

(c)

(a)

(b)

(c)

(d)

LIGHT EMITTING DEVICE, RESIN PACKAGE, RESIN-MOLDED BODY, AND METHODS FOR MANUFACTURING LIGHT EMITTING DEVICE, RESIN PACKAGE AND RESIN-MOLDED BODY

CROSS-REFERENCE TO RELATED APPLICATIONS

The present application is a continuation of U.S. patent application Ser. No. 15/360,316, filed Nov. 23, 2016, which is a continuation of U.S. patent application Ser. No. 14/928,550, filed Oct. 30, 2015 (now U.S. Pat. No. 9,537,071, issued Jan. 3, 2017), which is a continuation of U.S. patent application Ser. No. 13/969,182, filed Aug. 16, 2013 (now U.S. Pat. No. 9,287,476, issued Mar. 15, 2016), which is a continuation of U.S. patent application Ser. No. 12/737,940, filed on May 13, 2011 (now U.S. Pat. No. 8,530,250 issued Sep. 10, 2013), which is a U.S. national stage entry of International Patent Application No. PCT/JP2009/004170, filed Aug. 27, 2009, which claims priority to Japanese Patent Application No. 2008-225408, filed Sep. 3, 2008, the entireties of which are hereby incorporated by reference.

TECHNICAL FIELD

The present invention relates to a light emitting device used for light equipment, a display, a backlight of a mobile telephone, a movie lighting auxiliary light source, and other general consumer light sources, and to a method for manufacturing a light emitting device.

BACKGROUND ART

A light emitting device using light emitting elements is small, provides good power efficiency, and emits light of bright color. Further, the light emitting elements are semiconductor elements, and therefore there is no concern for blowout. The light emitting elements have characteristics of good initial driving performance and are robust against vibration and repetition of on and off of lighting. The light emitting elements have these good characteristics, and therefore light emitting devices using light emitting elements such as light emitting diodes (LEDs) and laser diodes (LDs) are utilized as various light sources.

FIG. 14 is a perspective view illustrating a method for manufacturing a conventional light emitting device. FIG. 15 is a perspective view illustrating an intermediate of the conventional light emitting device. FIG. 16 is a perspective view illustrating the conventional light emitting device.

Conventionally, as a method for manufacturing a light emitting device, a method is disclosed for insert-molding a lead frame with a non-translucent, light reflecting white resin, and molding a resin-molded body which has concave cups at predetermined intervals through the lead frame (e.g., refer to Patent Document 1). Although quality of a material of a white resin is not clearly described, as is insertion-molding performed and as is clear from the figures, a general thermoplastic resin is used. As a general thermoplastic resin, for example, a thermoplastic resin such as liquid crystal polymer, PPS (polyphenylene sulfide), and nylon is often used as a light blocking resin-molded body (e.g., refer to Patent Document 2).

However, the thermoplastic resin has little adhesion with a lead frame, and the resin part and lead frame are likely to be detached. Further, the thermosetting resin has lower resin fluidity of the resin and therefore is not adequate to mold a resin-molded body of a complicated shape, and has little light resistance. In recent years in particular, the output of a light emitting element is remarkably improved and, as the output of a light emitting element is increased, light deterioration of a package made of a thermoplastic resin becomes more distinct.

In order to solve the above problems, a light emitting device using a thermosetting resin for a material of a resin-molded body is disclosed (e.g., refer to Patent Document 3). FIG. 17 is a perspective view and sectional view illustrating a conventional light emitting device. FIG. 18 is a schematic sectional view illustrating a method for manufacturing the conventional light emitting device. It is disclosed that, with this light emitting device, metal wires are formed from a metal foil by a common method such as punching or etching and are further arranged in a mold of a predetermined shape, and a thermosetting resin is filled in a mold resin inlet to transfer-mold.

However, this manufacturing method has difficulty in manufacturing multiple light emitting devices in a short time. Further, there is a problem that a great amount of a resin of a runner part is discarded per one light emitting device.

As a different light emitting device and manufacturing method therefor, an optical semiconductor element mounting package substrate which has a light reflecting thermosetting resin composition layer on the wiring substrate, and manufacturing method therefor are disclosed (e.g., refer to Patent Document 4). FIG. 19 is a schematic view illustrating steps of manufacturing a conventional light emitting device. This optical semiconductor element mounting package substrate is manufactured as an optical semiconductor element mounting package substrate of a matrix pattern which has a plurality of concave parts, by attaching a printed-wiring board having a flat plate shape to a mold, filling a light reflecting thermosetting resin composition in the mold, and heating and pressuring molding the light reflecting thermosetting resin by means of a transfer-molding machine. Further, it is also disclosed that a lead frame is used instead of a printed-wiring board.

However, these wiring board and lead frame have a flat plate shape and have a small adhering area because a thermosetting resin composition is arranged on this flat shape, and therefore there is a problem that, for example, a lead frame and thermosetting resin composition are likely to be detached upon singulation.

Patent Document 1: Japanese Patent Application Laid-Open No. 2007-35794

Patent Document 2: Japanese Patent Application Laid-Open No. 11-087780

Patent Document 3: Japanese Patent Application Laid-Open No. 2006-140207

Patent Document 4: Japanese Patent Application Laid-Open No. 2007-235085

DETAILED DESCRIPTION

Figure 1:
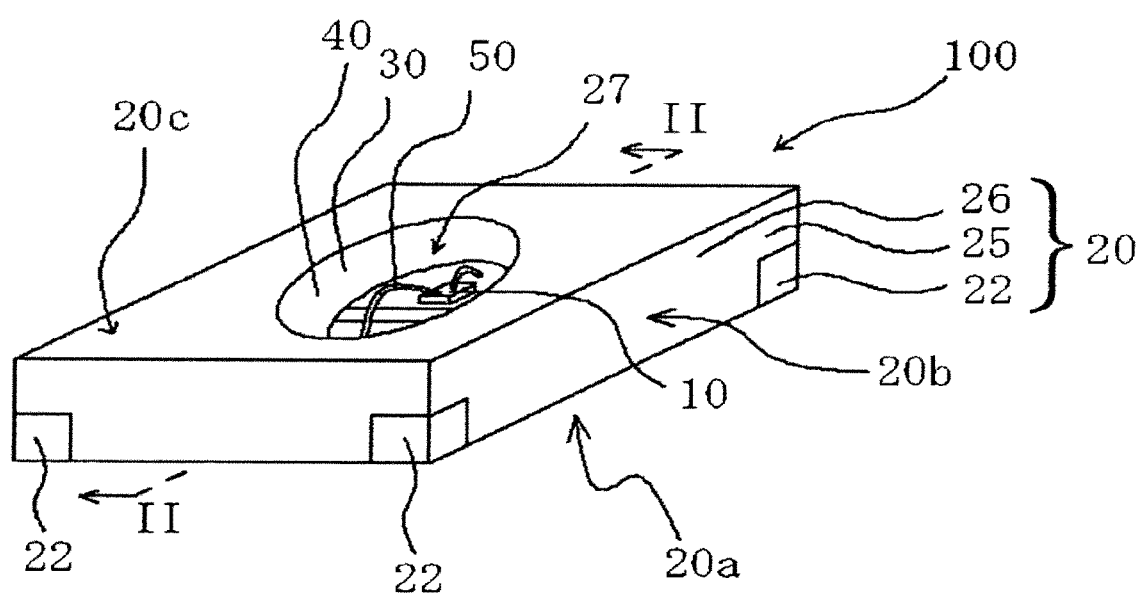
FIG. 1 is a perspective view illustrating a light emitting device according to a first embodiment.

In view of the above problems, an object of the present invention is to provide a simple and low-cost method for manufacturing, in a short time, multiple light emitting devices which has high adhesion between a lead frame and a thermosetting resin composition.

The present invention is earnestly studied and as a result is finally completed.

In this description, terms such as leads, a resin part, and resin package are used for a singulated light emitting device, and terms such as a lead frame and resin molded body are used in the stage prior to singulation.

The present invention relates to a method of manufacturing a light emitting device having a resin package which provides an optical reflectivity equal to or more than 70% at a wavelength between 350 nm and 800 nm after thermal curing, and in which a resin part and a lead are formed in a substantially same plane in an outer side surface. The method comprises: a step of sandwiching a lead frame provided with a notch part, by means of an upper mold and a lower mold; a step of transfer-molding a thermosetting resin containing a light reflecting material in a mold sandwiched by the upper mold and the lower mold to form a resin-molded body in the lead frame; and a step of cutting the resin molded body and the lead frame along the notch part. With the configuration, the thermosetting resin is filled in the notch parts, and therefore an adhering area between the lead frame and the thermosetting resin becomes large, so that it is possible to improve adhesion between the lead frame and the thermosetting resin. Further, a thermosetting resin having lower viscosity than a thermoplastic resin is used, so that it is possible to fill the thermosetting resin in the notch parts without leaving a gap. Further, it is possible to manufacture multiple light emitting devices at one time and greatly improve productive efficiency. Furthermore, it is possible to reduce runners which are discarded, and provide light emitting devices at low cost.

Preferably, plating processing is applied to the lead frame before the lead frame is sandwiched by the upper mold and the lower mold. In this case, in the manufactured light emitting device, plating processing is not applied to a cut surface and is applied to parts other than the cut surface. It is not necessary to apply plating processing per singulated light emitting device and it is possible to simplify a manufacturing method.

Preferably, the notch part in a cut part of the lead frame is about half the entire surrounding periphery. By this means, it is possible to reduce the weight of the lead frame and provide light emitting devices at low cost. Further, the part of the lead frame to be cut decreases, so that it is possible to better prevent the lead frame and the thermosetting resin from detaching.

In addition, the difference is that, while the thermosetting resin is filled in the notch parts, the thermosetting resin is not filled in hole parts which are described later. While the notch parts and hole parts penetrate the lead frame, grooves which are described later do not penetrate the lead frame.

Preferably, a hole part is provided in the lead frame before the lead frame is sandwiched by the upper mold and the lower mold. By this means, it is possible to reduce the weight of the lead frame more, and provide light emitting devices at low cost. It is possible to apply the plating processing to the hole parts, and consequently prevent exposure of the lead frame.

Preferably, a groove is provided in the lead frame before the lead frame is sandwiched by the upper mold and the lower mold. By this means, it is possible to reduce the weight of the lead frame more, and provide light emitting devices at low cost. It is possible to apply plating processing to the grooves, and consequently prevent exposure of the lead frame.

Preferably, the upper mold and the lower mold sandwich a part of the lead frame where a light emitting element is placed or near a hole part. By this means, it is possible to prevent the lead frame from flip-flopping and reduce burrs.

The present invention relates to a light emitting device having a resin package having an optical reflectivity equal to or more than 70% at a wavelength between 350 nm and 800 nm after thermal curing, wherein a resin part and a lead are formed in a substantially same plane in an outer side surface, and wherein at least one surface of a bottom surface and an upper surface of a lead is plated and the outer side surface of the lead is not plated. By this means, it is possible to prevent exposure of leads to which plating processing is not applied, and provide multiple light emitting devices at one time. Further, by applying plating processing to only the part which reflects light from a light emitting element, it is possible to improve the efficiency to extract light from the light emitting device.

Preferably, the lead is exposed at four corners of the resin package. The exposed parts of the leads are reduced compared to leads which are provided on the one entire side surface of a resin package, so that it is possible to improve adhesion between the resin part and the leads. Further, the insulating resin part is provided between a positive lead and a negative lead, so that it is possible to prevent short circuiting.

Preferably, four corners of the resin package are formed in an arc shape seen from a bottom surface side. It is also possible to employ a configuration where plating processing is applied to a part which is formed in an arc shape and is not applied to the cut surface. By this means, it is possible to expand a bonding area with, for example, a solder, and improve the boding strength.

Preferably, a step is provided in the lead. The differences in level are preferably provided in the bottom surface of the resin package. It is also possible to employ a configuration where plating processing is applied to a part in which differences in level are formed and is not applied to the cut surface. By this means, it is possible to expand a bonding area with, for example, a solder, and improve the boding strength.

The present invention relates to a method for manufacturing a resin package having an optical reflectivity equal to or more than 70% at a wavelength between 350 nm and 800 nm after thermal curing, wherein a resin part and a lead are formed in a substantially same plane in an outer side surface. The method comprising: a step of sandwiching a lead frame provided with a notch part, by means of an upper mold and a lower mold; a step of transfer-molding a thermosetting resin containing a light reflecting material in a mold sandwiched by the upper mold and the lower mold to form a resin-molded body in the lead frame; and a step of cutting the resin-molded body and the lead frame along the notch part. With the configuration, the thermosetting resin is filled in the notch parts, and therefore an adhering area between the lead frame and the thermosetting resin becomes large, so that it is possible to improve adhesion between the lead frame and the thermosetting resin. Further, a thermosetting resin having lower viscosity than a thermoplastic resin is used, so that it is possible to fill the thermosetting resin in the notch parts without leaving a gap. Further, it is possible to manufacture multiple resin packages at one time and greatly improve productive efficiency. Furthermore, it is possible to reduce runners which are discarded, and provide resin packages at low cost.

Preferably, plating processing is applied to the lead frame before the lead frame is sandwiched by the upper mold and the lower mold. In this case, in the manufactured resin package, plating processing is not applied to a cut surface and is applied to parts other than the cut surface. It is not necessary to apply plating processing per singulated resin package and it is possible to simplify a manufacturing method.

The present invention relates to a resin package having an optical reflectivity equal to or more than 70% at a wavelength between 350 nm and 800 nm after thermal curing, wherein a resin part and a lead are formed in a substantially same plane in an outer side surface, and wherein at least one surface of a bottom surface and an upper surface of a lead is plated and the outer side surface of the lead is not plated. By this means, it is possible to prevent exposure of leads to which plating processing is not applied, and provide multiple resin packages at one time. Further, by applying plating processing to only the part which reflects light from a light emitting element, it is possible to improve the efficiency to extract light from the light emitting device.

The present invention relates to a method of manufacturing a resin-molded body having an optical reflectivity equal to or more than 70% at a wavelength between 350 nm and 800 nm after thermal curing, wherein a plurality of concave parts are formed, and in which a part of a lead frame is exposed in inner bottom surfaces of the concave parts. The method comprises: a step of sandwiching the lead frame by means of an upper mold which has convex parts in positions where the concave parts adjacent in the resin molded body are molded and a lower mold, the lead frame being provided with notch parts; a step of transfer-molding a thermosetting resin containing a light reflecting material in a mold sandwiched by the upper mold and the lower mold to fill the thermosetting resin in the notch parts, and forming the resin-molded body in the lead frame. With this configuration, it is possible to manufacture multiple light emitting devices at one time and greatly improve productive efficiency.

The present invention relates to a resin-molded body having an optical reflectivity equal to or more than 70% at a wavelength between 350 nm and 800 nm after thermal curing, wherein a plurality of concave parts are formed and a part of a lead frame is exposed in inner bottom surfaces of the concave parts, and wherein the lead frame has notch parts and a thermosetting resin which becomes the resin-molded body is filled, the resin-molded body having a sidewall between adjacent concave parts. By this means, it is possible to provide a resin-molded body of good thermal resistance and light resistance.

The light emitting device and manufacturing method therefor according to the present invention can provide a light emitting device which provides high adhesion between a lead frame and a resin-molded body. Further, it is possible to provide multiple light emitting devices in a short time and greatly improve production efficiency. Furthermore, it is possible to reduce runners which are discarded, and provide light emitting devices at low cost.

Hereinafter, the preferred embodiments of a method for manufacturing a light emitting device and a light emitting device according to the present invention will be described in detail with drawings. However, the present invention is not limited to this embodiment.

First Embodiment (Light Emitting Device)

Figure 2:
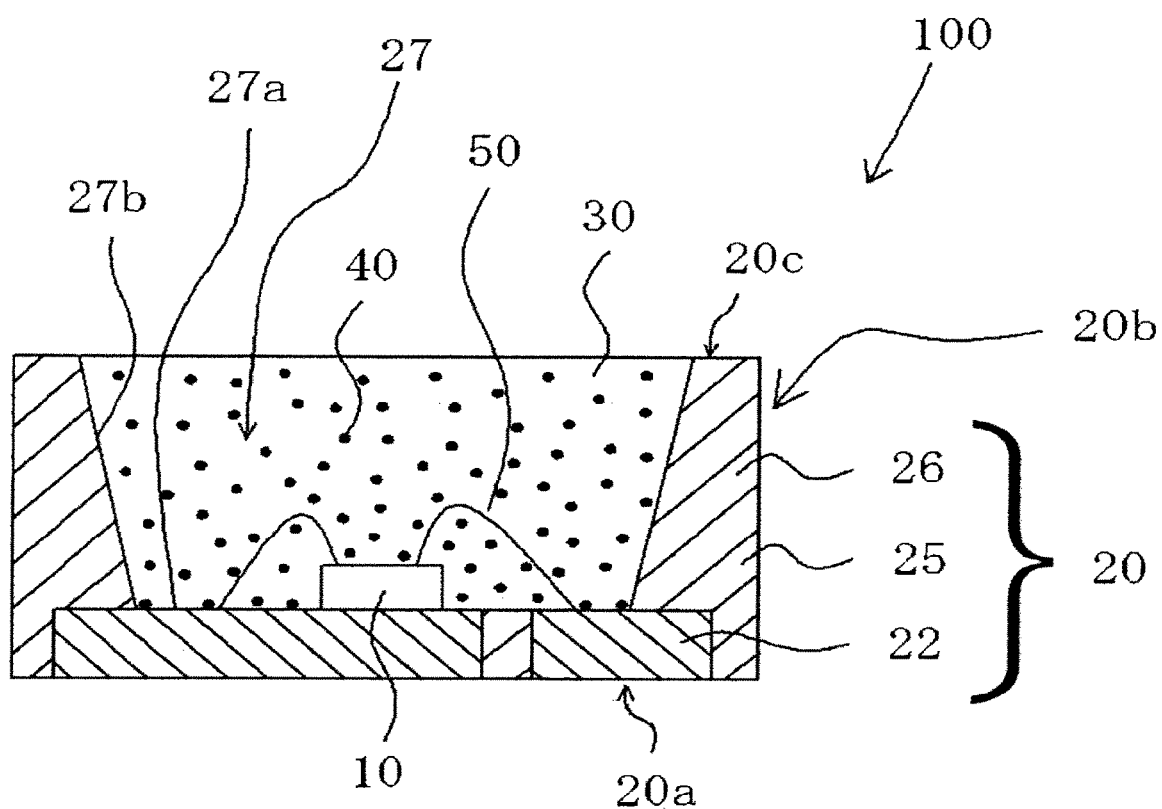
FIG. 2 is a sectional view illustrating the light emitting device according to the first embodiment.
Figure 3:
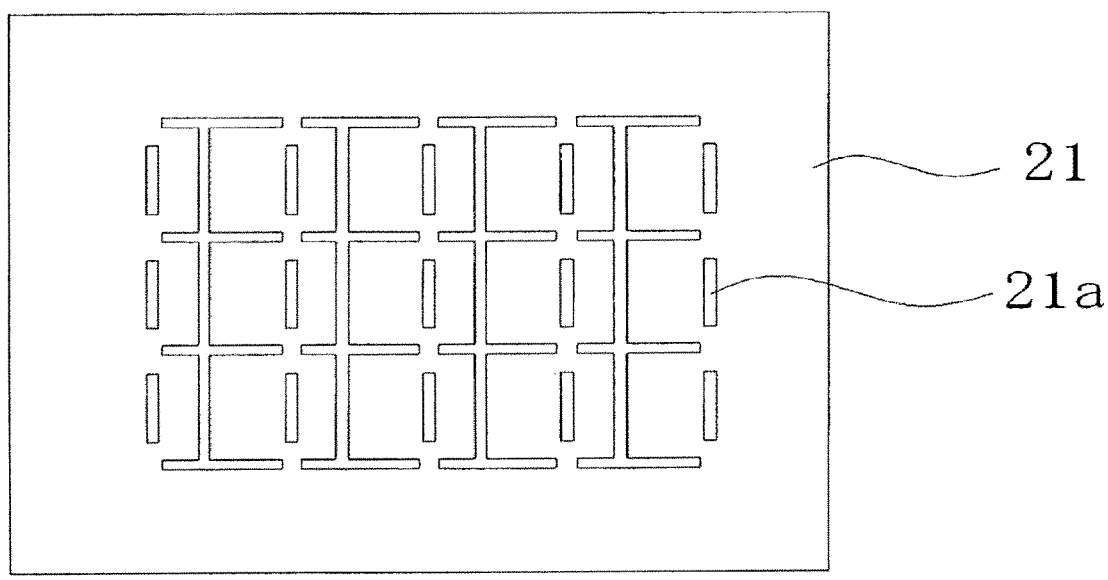
FIG. 3 is a plan view illustrating a lead frame used in the first embodiment.

A light emitting device according to a first embodiment will be described. FIG. 1 is a perspective view illustrating a light emitting device according to the first embodiment. FIG. 2 is a sectional view illustrating a light emitting device according to the first embodiment. FIG. 2 is a sectional view taken along line II-II illustrated in FIG. 1. FIG. 3 is a plan view illustrating a lead frame used in the first embodiment.

A light emitting device 100 according to the first embodiment provides an optical reflectivity equal to or greater than 70% at the wavelength between 350 nm and 800 nm after thermal curing, and has a resin package 20 in which a resin part 25 and leads 22 are formed in the substantially same plane in outer side surfaces 20b. Plating processing is applied to at least one surface of the bottom surface (an outer bottom surface 20a of the resin package 20) and the upper surface (an inner bottom surface 27a of a concave part 27) of the leads 22. By contrast with this, plating processing is not applied to the side surfaces of the leads 22 (the outer side surfaces 20b of the resin package 20). The resin part 25 occupies a large area in the outer side surfaces 20b of the resin package 20, and leads 22 are exposed from corner parts.

The resin package 20 is formed with the resin part 25 which mainly contains a light reflecting material 26, and the leads 22. The resin package 20 has the outer bottom surface 20a in which the leads 22 are arranged, outer side surfaces 20b in which part of the leads 22 are exposed, and the outer upper surface 20c in which an opening concave part 27 is formed. In the resin package 20, the concave part 27 having an inner bottom surface 27a and inner side surface 27b is formed. The leads 22 are exposed in the inner bottom surface 27a of the resin package 20 and the light emitting element 10 is placed on the leads 22. In the concave part 27 of the resin package 20, a sealing member 30 which covers the light emitting element 10 is arranged. The sealing member 30 contains a fluorescent material 40. The light emitting element 10 is electrically connected with the leads 22 through wires 50. The leads 22 are not arranged on the outer upper surface 20c of the resin package 20.

Parts from which the leads 22 are exposed have the half or less length than the entire surrounding length of the outer side surfaces 20b of the resin package 20. In a method for manufacturing a light emitting device which is described below, notch parts 21a are provided in a lead frame 21 and the lead frame 21 is cut along the notch parts 21a and, therefore, the cut part of the lead frame 21 is a part which is exposed from the resin package 20.

In the resin package 20, the leads 22 are exposed from the four corners. The leads 22 are exposed in the outer side surfaces 20b, and are not subjected to plating processing. Further, the leads 22 may be adapted to be exposed in the outer bottom surface 20a and subjected to plating processing. In addition, it is possible to apply plating processing to the outer side surfaces 20b of the leads 22 after singulation.

The light emitting device 100 provides the optical reflectivity equal to or more than 70% at the wavelength between 350 nm and 800 nm after thermal curing. This means that the optical reflectivity in a visible light area is high. The light emitting element 10 preferably provides a light emission peak wavelength between 360 nm and 520 nm, and can also use a light emission peak wavelength between 350 nm and 800 nm. More preferably, the light emitting element 10 has a light emission peak wavelength in a short wavelength region of visible light between 420 nm and 480 nm. This resin package 20 has good light resistance against light of a short wavelength equal to or less than 480 nm, and is less likely to be deteriorated. Further, this resin package 20 is not likely to be deteriorated even when the light emitting element 10 generates heat by applying the current thereto, and has good thermal resistance.

It is preferable to use as the resin package 20 a translucent thermosetting resin highly filled with a light reflecting material. It is preferable to use, for example, a thermosetting resin which provides the optical transmittance equal to or more than 80% at 350 nm to 800 nm, and it is more preferable to use a thermosetting resin which provides optical transmittance equal to or more than 90%. This is because it is possible to prevent deterioration of the resin package 20 by reducing light which is absorbed by the thermosetting resin. The light reflecting material 26 preferably reflects 90% or more light from the light emitting element 10, and more preferably reflects 95% or more light. Further, the light reflecting material 26 preferably reflects 90% or more light from the fluorescent material 40, and more preferably reflects 95% or more light. By reducing the amount of light which is absorbed by the light reflecting material 26, it is possible to improve the efficiency to extract light from the light emitting device 100.

Although the light emitting device 100 may have any shape, the light emitting device 100 may have a polygonal shape such as a generally rectangular parallelepiped, generally cube, or generally hexagonal column. The concave part 27 preferably expands in the opening direction, and may have a cylindrical shape. The concave part 27 can adopt a generally circular shape, generally oval shape, or generally polygonal shape.

Hereinafter, each member will be described below.

(Light Emitting Element)

Although a light emitting element is preferably used in which a semiconductor such as GaAlN, ZnS, SnSe, SiC, GaP, GaAlAs, AlN, InN, AlInGaP, InGaN, GaN or AlInGaN is formed on a substrate as a light emitting layer, the semiconductor is not limited to these. Although the light emitting element which provides a light emission peak wavelength between 360 nm and 520 nm is preferable, and a light emitting element which provides a light emission peak wavelength between 350 nm and 800 nm can be used. More preferably, the light emitting element 10 has the light emission peak wavelength in the short wavelength region of visible light between 420 nm and 480 nm.

The light emitting element adopting a face-up structure can be used, and, in addition, the light emitting element adopting a face-down structure can also be used. The size of the light emitting element is not particularly limited, and light emitting elements having sizes of 350 µm (350-µm-square), 500 µm (500-µm-square) and 1 mm (I-mm·square) can be used. Further, a plurality of light emitting elements can be used, and all of the light emitting elements may be the same type or may be different types which emit emission colors of red, green and blue of three primary colors of light.

(Resin Package)

The resin package has and is made by integrally molding a resin part formed with a thermosetting resin and the leads. Although the resin package provides an optical reflectivity equal to or more than 70% at 350 nm to 800 nm, the resin package more preferably provides an optical reflectivity equal to or more than 80% at 420 nm to 520 nm. Further, the resin package preferably has a high reflectivity in a light emitting area of a light emitting element and a light emitting area of a fluorescent material.

The resin package has an outer bottom surface, outer side surfaces and an outer upper surface. The leads are exposed from the outer side surfaces of the resin package. The resin part and leads are formed in the substantially same plane. This substantially same plane means that the resin part and leads are formed in the same cutting step.

The outer shape of the resin package is not limited to a generally rectangular parallelepiped, and may have a generally cube, generally hexagonal shape or other polygonal shapes. Further, the resin package seen from the outer upper surface side can also adopt a generally triangular shape, generally square shape, generally pentagonal shape or generally hexagonal shape.

The resin package forms a concave part having an inner bottom surface and an inner side surface. The leads are arranged in the inner bottom surface of the concave part. The concave part seen form the outer upper surface side can adopt various shapes such as a generally circular shape, generally oval shape, generally square shape, generally polygonal shape or combination of these. Although the concave part preferably has a shape expanding in the opening direction, the concave part may have a cylindrical shape. Although the concave part may be provided with a smooth inclination, the concave part may be formed in a shape which has a minute concavity and convexity in its surface and diffuses light.

The leads are provided at predetermined intervals to form a pair of positive and negative leads. Plating processing is applied to the leads in the inner bottom surface of the concave part and the leads of the outer bottom surface of the resin package. Although this plating processing can be performed before a resin-molded body is cut out, it is preferable to use a lead frame to which plating processing is applied in advance. By contrast with this, plating processing is not applied to the side surfaces of the leads.

(Resin Part and Resin-Molded Body)

As the material of the resin part and resin-molded body, a triazine derivative epoxy resin, which is a thermosetting resin is preferably used. Further, the thermosetting resin can contain an acid anhydride, antioxidant, demolding member, light reflecting member, inorganic filler, curing catalyst, light stabilizer, and lubricant. The light reflecting member uses titanium dioxide and is filled with 10 to 60% by weight of titanium dioxide.

The resin package is not limited to the above mode, and is preferably made of at least one selected from the group consisting of an epoxy resin, modified epoxy resin, silicone resin, modified silicone resin, acrylate resin, and urethane resin of a thermosetting resin. Particularly, the epoxy resin, modified epoxy resin, silicone resin or modified silicone resin is preferable. For example, it is possible to use as a solid epoxy resin composition, 100 parts by weight of a clear and colorless mixture in which the epoxy resin consisting of triglycidylisocyanuratem, bisphenol hydride A glycidyl ether and so on, and an acid anhydride consisting of hexahydrophthalic anhydride, 3-methylhexahydrophthalic anhydride, 4-methylhexahydrophthalic anhydride and so on equivalent to the epoxy resin, have been dissolved and mixed, which has been added with: 0.5 parts by weight of DBU (1,8-Diazabicyclo(5,4,0) undecene-7) as a curing accelerator; 1 parts by weight of ethylene glycol as a promoter; 10 parts by weight of a titanium oxide pigment; and 50 parts by weight of a glass fiber, and which has entered the B stage by being heated and partially cured and reacted.

(Lead and Lead Frame)

Although a metal plate of a flat plate shape can be used for a lead frame, a metal plate in which differences in level or concavity and convexity are provided can be used.

The lead frame is formed by, for example, punching or etching a metal plate of a flat plate shape. A concavity and convexity are formed in a sectional shape of the etched lead frame, so that it is possible to improve adhesion between the lead frame and resin molded body. Particularly when a thin lead frame is used, although, with punching, differences in level or concave-convex shapes are formed to improve adhesion between a lead frame and resin-molded body, the effect of improving adhesion is little because the differences in level or concave-convex shapes are small. However, etching can form concave-convex shapes in the entire sectional (etched part) part of the lead frame, so that it is possible to increase a bonding area between the lead frame and resin-molded body and mold a resin package of better adhesion.

By contrast with this, the method of punching a metal plate of a flat plate shape increases cost required for replacement parts due to friction of a mold resulting from the punching, and increases cost required for manufacturing the lead frame. By contrast with this, with etching, a punching mold is not used, so that it is possible to manufacture a lead frame per package at low cost when the number of packages cut from one frame is greater.

The etching may be performed such that the lead frame is penetrated, or may be started from only one surface such that the lead frame is not penetrated.

The notch parts are formed such that a pair of positive and negative leads are provided when the resin-molded body is singulated to the resin package. The notch parts are formed such that the area for cutting the leads is reduced when the resin-molded body is cut. For example, the notch parts are provided in a horizontal direction such that a pair of positive and negative leads are provided, and further notch parts are provided in positions corresponding to cut-out parts for singulating the resin-molded body. Meanwhile, part of the lead frame is jointed such that part of the lead frame does not drop or the leads are exposed in the outer side surfaces of the resin package. To singulate the resin-molded body using a singulation saw, the notch parts are preferably formed vertically and horizontally or linearly in an oblique direction.

The lead frame is formed using an electrical good conductor such as iron, phosphor bronze or a copper alloy. Further, to increase the reflectivity with respect to light from the light emitting element, metal plating using silver, aluminum, copper, gold or the like can be applied to the lead frame. Although metal plating is preferably is applied to the lead frame before the lead frame is sandwiched by the upper mold and lower mold, that is, for example, after the notch parts are provided or etching processing is performed, metal plating can also be applied to the lead frame before the lead frame is integrally molded with the thermosetting resin.

(Sealing Member)

The material of a sealing member is a thermosetting resin. The sealing member is preferably made of at least one selected from the group consisting of an epoxy resin, modified epoxy resin, silicone resin, modified silicone resin, acrylate resin and urethane resin of a thermosetting resin, and is more preferably made of an epoxy resin, modified epoxy resin, silicone resin or modified silicone resin. The sealing member is preferably made of a hard material to protect the light emitting element. Further, it is preferable to use for the sealing resin a resin having good thermal resistance, weather resistance and light resistance. To provide a predetermined function, the sealing member may be mixed with at least one selected from the group consisting of filler, diffusing agent, pigment, fluorescent material and reflecting material. The sealing member may contain a diffusing agent. As a specific diffusing agent, for example, barium titanate, titanium oxide, aluminum oxide or silicon oxide is adequately used. Further, the sealing member can contain an organic or inorganic colored dye or colored pigment in order to cut an undesirable wavelength. Further, the sealing member can also contain a fluorescent material which absorbs light from the light emitting element and converts the wavelength.

(Fluorescent Material)

A fluorescent material may be a material which absorbs light from the light emitting element, and converts the wavelengths into light of a different wavelength. The fluorescent material is preferably selected from, for example, at least any one of a nitride phosphor, oxynitride phosphor or sialon phosphor mainly activated by a lanthanoid element such as Eu or Ce, alkaline-earth halogen apatite phosphor, alkaline-earth metal boric acid halogen phosphor, alkaline-earth metal aluminate phosphor, alkaline earth silicate, alkaline-earth sulfide, alkaline-earth thiogallate, alkaline-earth silicon nitride or germanate mainly activated by a lanthanoid element such as Eu or a transition metal such as Mn, rare-earth aluminate or rare-earth silicon nitride mainly activated by a lanthanoid element such as Ce, or organic and organic complexes mainly activated by a lanthanoid element such as Eu. As a specific example, although the following phosphors can be used, the fluorescent material is not limited to these.

The nitride phosphor mainly activated by a lanthanoid element such as Eu or Ce includes, for example, $M_2Si_5N_8$:Eu or $MAlSiN_3$:Eu (where M is at least one or more selected from Sr, Ca, Ba, Mg and Zn). Further, the nitride phosphor also includes $MSi_7N_{10}$:Eu, $M_{1.8}Si_5O_{0.2}N_8$:Eu or $M_{0.9}Si_7O_{0.1}N_{10}$:Eu in addition to $M_2Si_5N_8$:Eu (where M is at least one or more selected from Sr, Ca, Ba, Mg and Zn).

The oxynitride phosphor mainly activated by a lanthanoid element such as Eu or Ce includes, for example, $MSi_2O_2N_2$: Eu (where M is at least one or more selected from Sr, Ca, Ba, Mg and Zn).

The sialon phosphor mainly activated by a lanthanoid element such as Eu or Ce includes, for example, $M_{p/2}Si_{12p-q}Al_{p+q}O_qN_{16-p}$:Ce or M-Al—Si—O—N (M is at least one selected from Sr, Ca, Ba, Mg and Zn, q is 0 to 2.5, and p is 1.5 to 3).

The alkaline-earth halogen apatite phosphor mainly activated by a lanthanoid element such as Eu or a transition metal such as Mn includes, for example, $M_5(PO_4)_3X$:R (M is at least one or more selected from Sr, Ca, Ba, Mg and Zn, X is at least one or more selected from F, Cl, Br and I and R is at least one or more selected from Eu, Mn, Eu and Mn).

The alkaline-earth metal boric acid halogen phosphor includes, for example, $M_2B_5O_9X$:R (M is at least one or more selected from Sr, Ca, Ba, Mg and Zn, X is at least one or more selected from F, Cl, Br and I, and R is at least one or more selected from Eu, Mn, Eu and Mn).

The alkaline-earth metal aluminate phosphor includes, for example, $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, or $BaMgAl_{10}O_{17}$:R (R is at least one or more selected from Eu, Mn, Eu and Mn).

The alkaline-earth sulfide phosphor includes, for example, $La_2O_2S$:Eu, $Y_2O_2S$:Eu or $Gd_2O_2S$:Eu.

The rare-earth aluminate phosphor mainly activated by a lanthanoid element such as Ce includes, for example, YAG phosphors represented by composition formulae of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y,Gd)_3(Al,Ga)_5O_{12}$:Ce. Further, the rare-earth aluminate phosphor also includes $Tb_3Al_5O_{12}$:Ce or $Lu_3Al_5O_{12}$:Ce where part or all of Y is substituted with, for example, Tb or Lu.

The other phosphors include, for example, ZnS:Eu, $Zn_2GeO_4$:Mn or $MGa_2S_4$:Eu (where M is at least one or more selected from Sr, Ca, Ba, Mg and Zn).

By using one kind alone or two or more kinds in combination, these phosphors can realize blue, green, yellow and red and, in addition, tinges such as turquoise, greenish yellow and orange which are intermediate colors of blue, green, yellow and red.

(Others)

In the light emitting device, a zener diode can also be further provided as a protective element. The zener diode can be placed on the leads in the inner bottom surface by being placed apart from the light emitting element. Further, a configuration can also be employed where a zener diode is placed on leads in the inner bottom surface of the concave part and a light emitting
element is placed on the zener diode. The size of 280 μm and, in addition, the size of 300 μm can be used.

Figure 4:
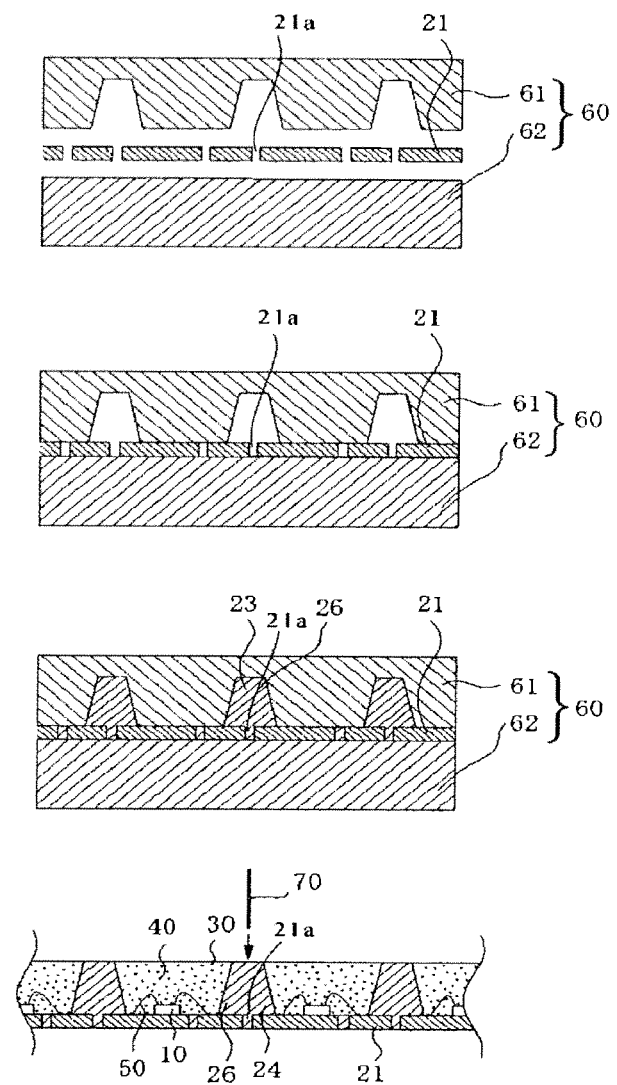
FIG. 4 is a schematic sectional view illustrating a method for manufacturing a light emitting device according to the first embodiment.
Figure 5:
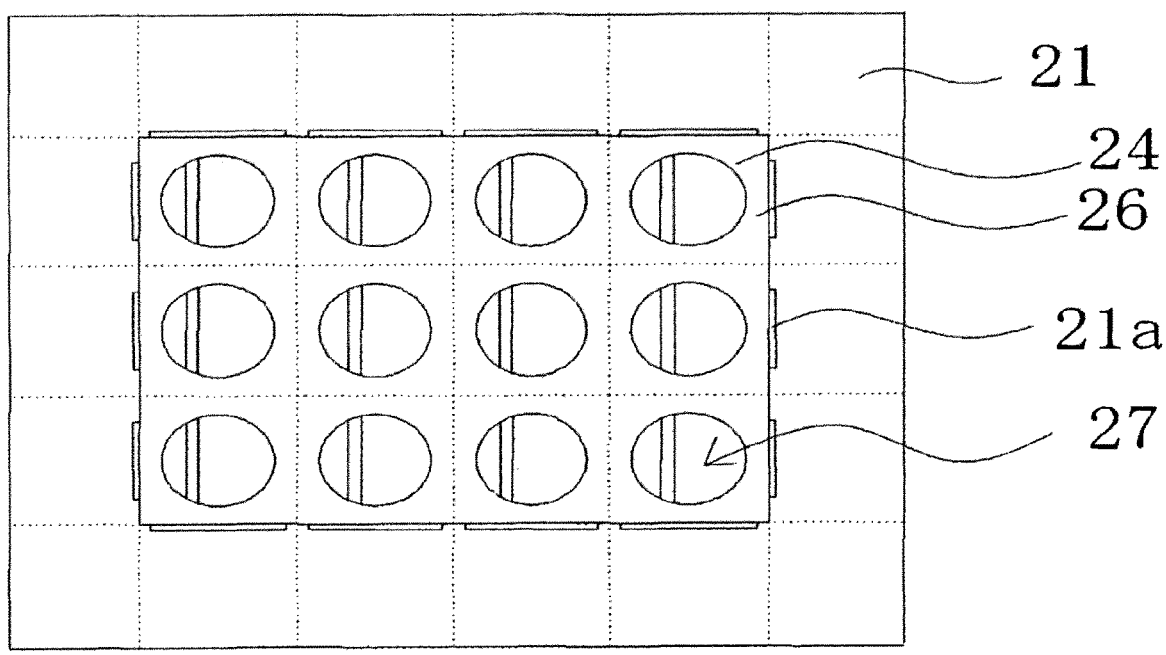
FIG. 5 is a plan view illustrating a resin-molded body according to the first embodiment.

Method for Manufacturing Light Emitting Device According to First Embodiment The method for manufacturing a light emitting device according to the first embodiment will be described. FIG. 4 is a schematic sectional view illustrating a method for manufacturing a light emitting device according to the first embodiment. FIG. 5 is a plan view illustrating a resin-molded body according to the first embodiment.

The method for manufacturing a light emitting device according to the first embodiment includes the steps of sandwiching the lead frame 21 provided with the notch parts 21a by means of an upper mold 61 and a lower mold 62, transfer-molding a thermosetting resin 23 containing the light reflecting material 26, in a mold 60 sandwiched by the upper mold 61 and the lower mold 62 to form a resin-molded body 24 in the lead frame 21, and cutting the resin-molded body 24 and lead frame 21 along the notch parts 21a.

First, the mold 60 formed with the upper mold 61 and lower mold 62 used for transfer-molding will be described.

The upper mold 61 has a main body part of a flat plate which forms an upper part of the upper mold, an outer wall part which is formed in a frame shape from end parts of the main body, a plurality of projecting parts which project from the main body part, and an inlet which penetrates part of the outer wall part in the horizontal direction.

The outer wall part vertically projects from the end parts of the main body part, and has a first outer wall part, a second outer wall part, a third outer wall part and a fourth outer wall part which form a first outer side surface, a second outer side surface, a third outer side surface and a fourth outer side surface of the resin molded body, respectively. That is, the outer wall part is used for molding the outline of the resin-molded body, and formed in a rectangular shape seen from a plan view. The shape of the outer wall part only needs to be adequately formed according to a desirable shape of the resin-molded body.

The projecting parts contact the lead frame 21 upon transfer-molding, and can form an exposed part from which part of the lead frame 21 is exposed from the resin-molded body 24 by preventing the thermosetting resin 23 from flowing in the contacting parts. The projecting parts project downward from the main body part, and are formed by being surrounded by the outer wall. The parts of the projecting parts contacting the lead frame 21 are formed flat. To efficiently form a concave part in an area in the upper surface of the resin molded body 24, the projecting parts are preferably formed in one direction at equal intervals, and the projecting parts are preferably formed at equal intervals in a direction 90 degrees from the one direction of each projecting part.

The inlet is used to inject the thermosetting resin 23, and is formed penetrating in the horizontal direction in the lower end of the substantially center of the outer wall part. The inlet has a semicircular cross sectional surface, and is formed with a width narrowed toward the outlet part from the inlet part of the inlet.

Further, although not illustrated, a pin insertion hole which penetrates the main body part is formed in the upper part of the upper mold 61. The pin insertion hole is used for insertion of the pin when the resin-molded body 24 is demolded from the upper mold 61.

The lower mold 62 is a plate material with a predetermined thickness, and its surface is formed flat. The lower mold 62 is placed in contact with the upper mold 61 to mold a space part.

Next, each manufacturing step will be described.

After the notch parts 21a are provided, metal plating processing is applied to the lead frame 21.

First, the lead frame 21 provided with the notch parts 21a is sandwiched by the upper mold 61 and lower mold 62. By sandwiching the lead frame 21 by the upper mold 61 and lower mold 62, space is provided in the mold 60.

In this case, the notch parts 21a in positions where the concave parts 27 are formed are arranged such that the notch parts 21a are sandwiched by the projecting parts of the upper mold 61 and the lower mold 62. By this means, it is possible to prevent flip-flop of the lead frame 21 in the notch parts 21a, and reduce burrs.

Next, the thermosetting resin 23 containing the light reflecting material 26 is transfer-molded in the mold sandwiched by the upper mold 61 and lower mold 62, and the thermosetting resin 23 containing the light reflecting material 26 is injected through the inlet to the space provided in the mold 60 which forms the resin-molded body 24 on the lead frame 21 and is applied a predetermined temperature and pressure to transfer-mold. The lead frame 21 near the notch parts 21a are sandwiched by the upper mold 61 and lower mold 62, so that, when the thermosetting resin 23 is transfer-molded, it is possible to prevent flip-flop of the lead frame 21 and reduce burrs in the inner bottom surface 27a of the concave part 27.

The pin is inserted in the pin inserting part to remove the resin-molded body 24 from the upper mold 61. Preferably, the resin-molded body 24 is temporarily cured by being applied a predetermined temperature in the mold 60, then is removed from the mold 60 and is finally cured by being applied a higher temperature than temporary curing.

Next, the light emitting element 10 is placed on the lead frame 21 of the inner bottom surface 27a of the concave part 27 formed in the resin-molded body 24 to electrically connect with the lead frame 21 through the wires 50. With the step of placing the light emitting element 10, the resin-molded body 24 can be placed after the resin-molded body 24 is removed from the mold 60, or the light emitting element 10 may be placed on the resin package 20 obtained by cutting and singulating the resin-molded body 24. Further, the light emitting elements may be faced down and mounted without using the wires. After the light emitting element 10 is mounted on the lead frame 21, the sealing member 30 containing the fluorescent material 40 is filled and cured in the concave part 27.

Next, the resin-molded body 24 and lead frame 21 are cut along the notch parts 21a. The resin-molded body 24 in which a plurality of concave parts 27 are formed is cut in the longitudinal direction and lateral direction such that the sidewalls between adjacent concave parts 27 are separated in the substantially center. The cutting method uses a singulation saw, and starts singulation from the resin-molded body 24 side. By this means, in the cutting surface, the resin-molded body 24 and lead frame 21 are in the substantially same plane, and the lead frame 21 is exposed from the resin-molded body 24. By providing the notch parts 21a in this way, the lead frame 21 to be cut decreases, so that it is possible to prevent the lead frame 21 and resin-molded body 2,1 from being detached. Further, not only the upper surface of the lead frame 21, but also the side surfaces corresponding to the notch parts 21a adhere to the resin-molded body 24, so that the adhesion strength between the lead frame 21 and resin molded body 24 is improved.

Second Embodiment

Figure 6:
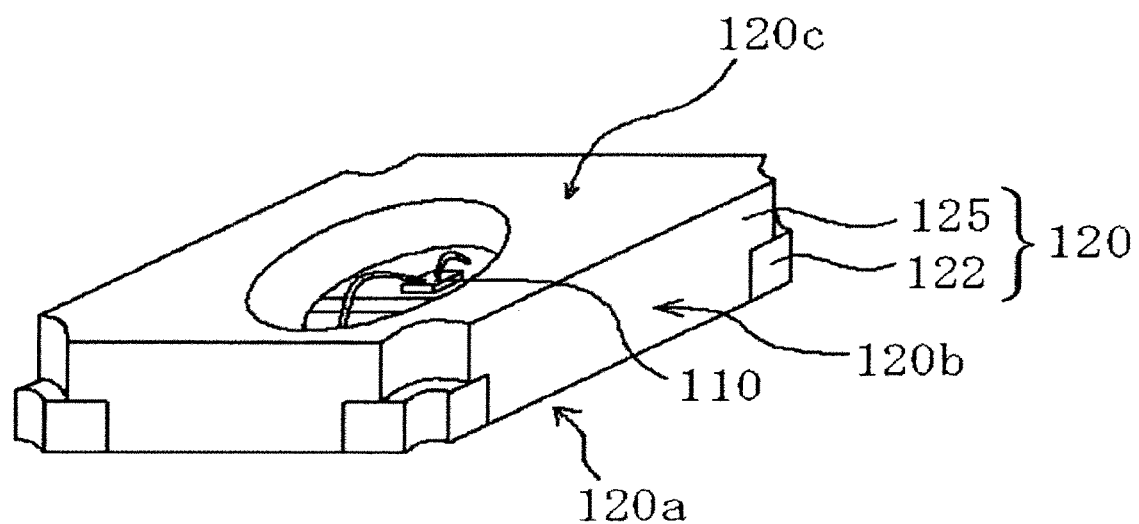
FIG. 6 is a perspective view illustrating a light emitting device according to a second embodiment.
Figure 7:
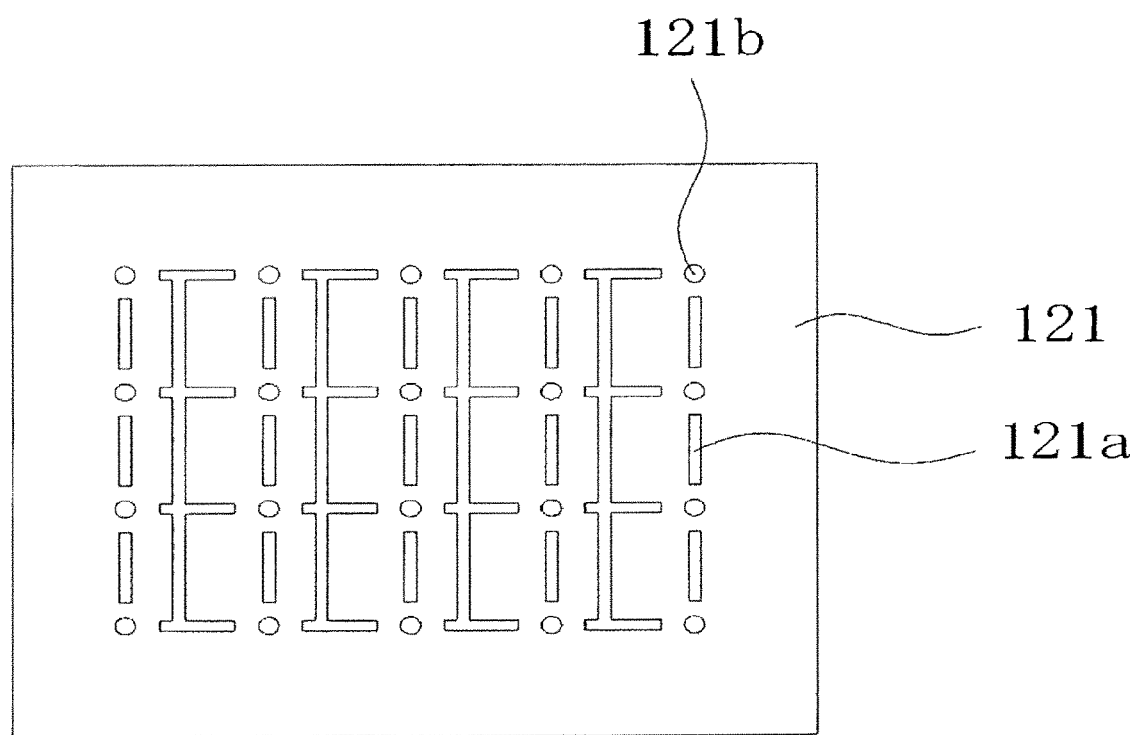
FIG. 7 is a plan view illustrating a lead frame used in the second embodiment.
Figure 8:
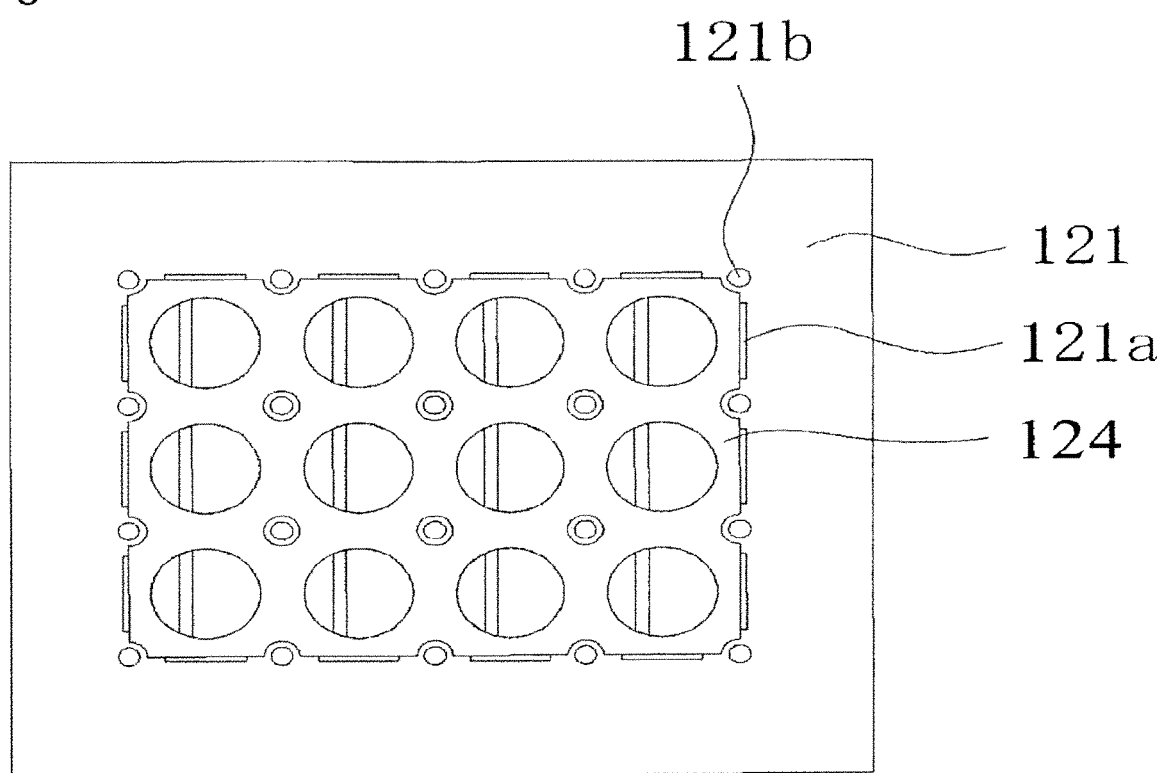
FIG. 8 is a plan view illustrating a resin-molded body according to the second embodiment.

A light emitting device according to a second embodiment will be described. FIG. 6 is a perspective view illustrating a light emitting device according to the second embodiment. FIG. 7 is a plan view illustrating a lead frame used in the second embodiment. FIG. 8 is a plan view illustrating a resin molded body according to the second embodiment. Description of some configurations employing the substantially same configuration as the light emitting device according to the first embodiment will be omitted where necessary.

With the light emitting device according to the second embodiment, the light emitting element 10 is placed in the concave part provided in the resin package 120. The corner parts of the outer upper surface 120c of the resin package 120 are formed in an arc shape. Further, the side surface of the lead 122 is formed in an arc shape seen from the upper surface, and the lead 122 is provided with a step such that the lead 122 slightly projects from the resin part 125 seen from the upper surface. Plating processing is applied to the upper surfaces, outer bottom surfaces 120a and arc-shaped curved parts of the projecting leads 122. By contrast with this, plating processing is not applied to the outer side surfaces 120b other than the arc-shaped parts of the leads 122. By increasing the parts to which plating processing is applied in this way, the bonding strength with a conductive material such as a solder increases.

Method for Manufacturing Light Emitting Device According to Second Embodiment

With the method for manufacturing a light emitting device according to the second embodiment, notch parts 121a and hole parts 121b are provided in the lead frame 121. Although the shapes of these hole pads 121b are preferably circular, the hole parts 121b can adopt a polygonal shape such as a square shape or hexagonal shape, or an oval shape. The positions of the hole parts 121 in the lead frame 121 are preferably provided on the extension of the notch parts 121a and near a point where the notch parts 121a cross each other. Although the hole parts 121b may adopt any sizes, the holes parts 121b are preferably wider to use for electrodes and increase the bonding strength with a conductive material. Further, it is possible to expand the adhering area with the conductive material, and increase the bonding strength.

Slightly larger holes than the shapes of the hole parts 121b are provided to cover the vicinity of the hole parts 121b of the lead frame 121.

The lead frame 121 in which the notch parts 121a are provided is sandwiched by an upper mold and lower mold. In this case, the vicinity of the hole parts 121b is sandwiched by the molds. By this means, upon transfer-molding, a thermosetting resin is not poured into the hole parts 121b and the thermosetting resin in the hole parts 121b do not need to be removed.

A thermosetting resin containing a light reflecting material is transfer-molded in the mold sandwiched by the upper mold and lower mold to form the resin-molded body 124 in the lead frame 121.

Plating processing is applied to the exposed part of the lead frame 121 of the resin-molded body 124. Plating processing is applied to the inner bottom surface of the concave part, outer bottom surface 120a of the resin package 120, circular inner surface of the lead frame 121 and the upper surface extending therefrom.

The resin-molded body 124 and lead frame 121 are cut along the notch parts 121a.

By performing the above steps, it is possible to provide the light emitting device according to the second embodiment. The holes 121b are provided on the extension of the notch parts 121a, so that, when singualtion is performed using a singualtion saw, it is possible to reduce the time required for cutting the lead frame 121 because the lead frame 121 to be cut is little. According to this manufacturing method, it is possible to easily provide in a short time a light emitting device which has many plated parts in the lead frame 121.

Third Embodiment

Figure 9:
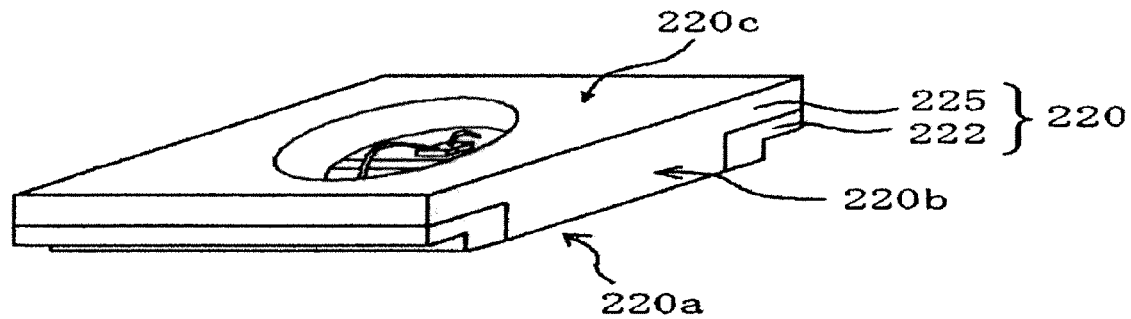
FIG. 9 is a perspective view illustrating a light emitting device according to a third embodiment.
Figure 10:
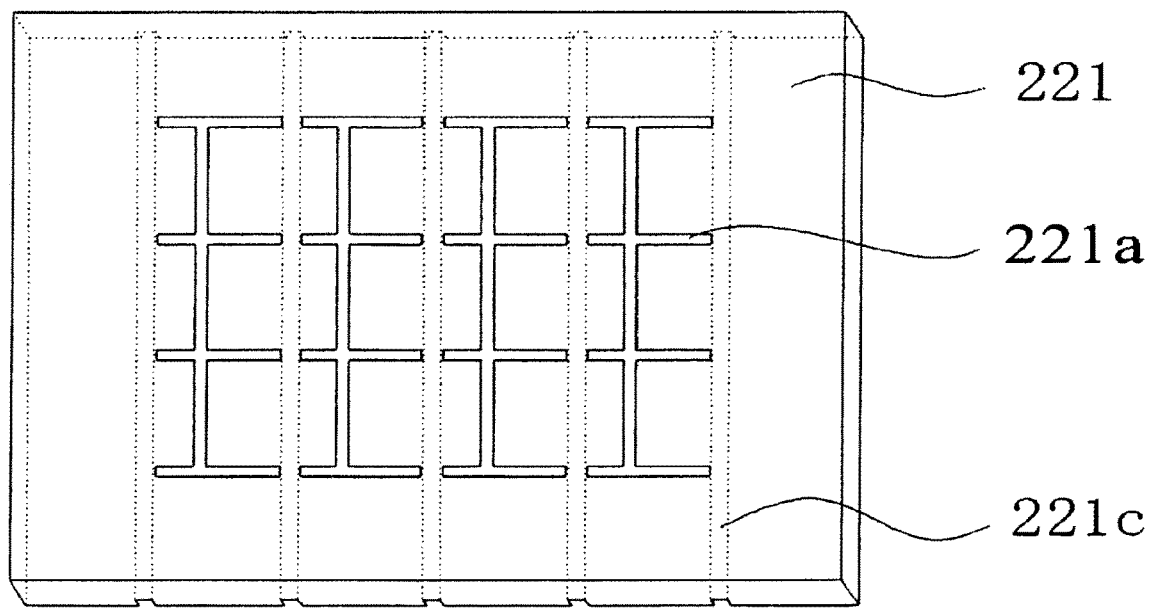
FIG. 10 is a plan view illustrating a lead frame used in the third embodiment.

A light emitting device according to a third embodiment will be described. FIG. 9 is a perspective view illustrating the light emitting device according to the third embodiment. FIG. 10 is a plan view illustrating a lead frame used in the third embodiment. Description of some configurations employing the substantially same configuration as the light emitting device according to the first embodiment will be omitted where necessary.

The light emitting device according to the third embodiment provides an optical reflectivity equal to or greater than 70% at the wavelength between 350 nm and 800 nm after thermal curing, and has a resin package 220 in which a resin part 225 and leads 222 are formed in the substantially same plane in an outer side surface 220b. Plating processing is applied to the bottom surface and upper surface of the leads 222, and is not applied to the outer side surfaces. The lead 222 has a predetermined thickness, and is provided with differences in level near the outer side surfaces of the resin package 220. Plating processing applied to the side surfaces which are one step deeper in the differences in level, and the bottom surface which slightly juts outward. By providing the plate difference in the lead 222 in this way, the bonding area increases, so that it is possible to improve the bonding strength with a conductive material such as a solder. Further, it is possible to reduce the thickness of part of the lead 222 to be cut using the singualtion saw, and reduce the cutting time. Further, singulation is started from the outer upper surface of the resin package 220 using the singualtion saw, and therefore burrs extending in the direction of the outer bottom surface are likely to be produced in the cutting surface of the lead 222. In case where the cutting surfaces and outer bottom surfaces of the leads are in the same plane, although there are cases where the light emitting device is inclined due to burrs when the light emitting device is mounted, differences in level are provided in the cutting surfaces of the leads and therefore the burrs do not reach the outer bottom surface, so that the light emitting device is not inclined due to the burrs.

In the lead 222 which is exposed from the resin package 220, the step is formed with a first surface which is exposed in the outer bottom surface 220a of the resin package 220, a second surface which is formed at a substantially right angle from the outer bottom surface 220a in an upward direction, a third surface which is formed at a substantially right angle from the second surface in the direction of the outer side surface of the resin package 220, and a fourth surface which is exposed in the outer side surface of the resin package 220. Although plating processing is applied to the first surface, second surface and third surface, plating processing is not applied to the fourth surface. The second surface and third surface can also be formed as one curved surface. When the second surface and third surface are formed as one curved surface, a solder readily expands in the step.

The resin package 220 forms a generally square shape in the outer upper surface 220c, and is covered by the resin part 225. A generally conic trapezoidal concave part is provided on the outer upper surface 220c side of the resin package 220.

Method for Manufacturing Light Emitting Device According to Third Embodiment With the method for manufacturing a light emitting device according to the third embodiment, grooves 221c of substantially straight lines are provided in the lead frame 221 on the side corresponding to the outer bottom surface side of the light emitting device. Although the depth of these grooves 221c is preferably half the thickness of the lead frame 221, the groove 221c may have about 1/5 to 4/5 of the depth. Although the width of this groove 221c is variously changed according to, for example, the distance to an adjacent concave part or the size of the light emitting device, the groove 221c only needs to have the depth that can be recognized as the step in the light emitting device when the center of the groove is cut.

The lead frame 221 provided with notch parts 221a is sandwiched by the upper mold and lower mold. The notch parts 221a are sandwiched by the upper mold and lower mold and prevented from flip-flopping upon transfer-molding.

By transfer-molding a thermosetting resin containing a light reflecting material in the mold sandwiched by the upper mold and lower mold, a resin-molded body is formed in the lead frame 221.

Plating processing is applied to the exposed part of the lead frame 221 of the resin-molded body. Plating processing is applied to the inner bottom surface of the concave part, the outer bottom surface 220a of the lead frame 221, and grooves 221c. Plating processing of these grooves 221c is applied to the first surface, second surface and third surface in the differences in level in the light emitting device.

The resin molded body and lead frame are cut along the notch parts 221a. Further, the resin-molded body is cut along the grooves 221c.

By performing the above steps, it is possible to provide the light emitting device according to the third embodiment. According to this manufacturing method, it is possible to easily provide in a short time a light emitting device which has many plated parts in the lead frame 121.

Fourth Embodiment

Figure 11:
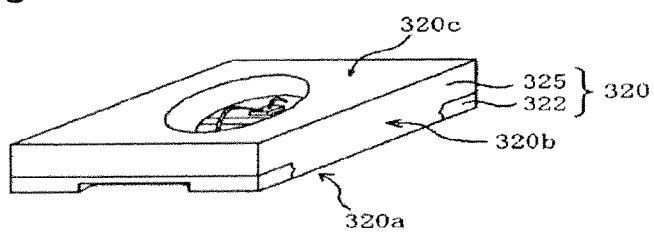
FIG. 11 is a perspective view illustrating a light emitting device according to a fourth embodiment.

A light emitting device according to a fourth embodiment will be described. FIG. 11 is a perspective view illustrating a light emitting device according to the fourth embodiment. Description of some configurations employing the substantially same configuration as the light emitting device according to the first embodiment will be omitted where necessary.

The light emitting device according to the fourth embodiment has differences in level which are dented in the portions of the outer side surfaces 320b, in the leads 322 of the outer side surfaces 320b of the resin package 320. In the lead 322 which is exposed from the resin package 320, the step is formed with a first surface which is provided in the outer bottom surface 320a of the resin package 320, a second surface which is formed at a substantially right angle from the outer bottom surface 320a in an upward direction, a third surface which is formed at a substantially right angle from the second surface in the direction of the outer side surface of the resin package 320, and a fourth surface of the outer side surface of the resin package 320. The outer upper surface 320c of the resin package 320 is formed in a generally rectangular shape formed with a resin part a25. Plating processing is applied to the outer bottom surface 320a, first surface, second surface provided with a step, third surface and the inner bottom surface of the concave part. By contrast with this, plating processing is not applied to the outer side surfaces 320b provided with no the step are not provided.

An etched lead frame is used for the leads 322. In the cut surface of the resin-molded body, the etched leads 322 have a concavity and convexity. This concavity and convexity improve adhesion between the resin part and leads.

By providing the differences in level in part of the leads 322, it is possible to expand the bonding area with a conductive material upon mounting, and increase the bonding strength. Further, a concavity is provided in the lead frame, so that it is easy to cut the lead frame and reduce the time required for cutting.

Fifth Embodiment

Figure 12:
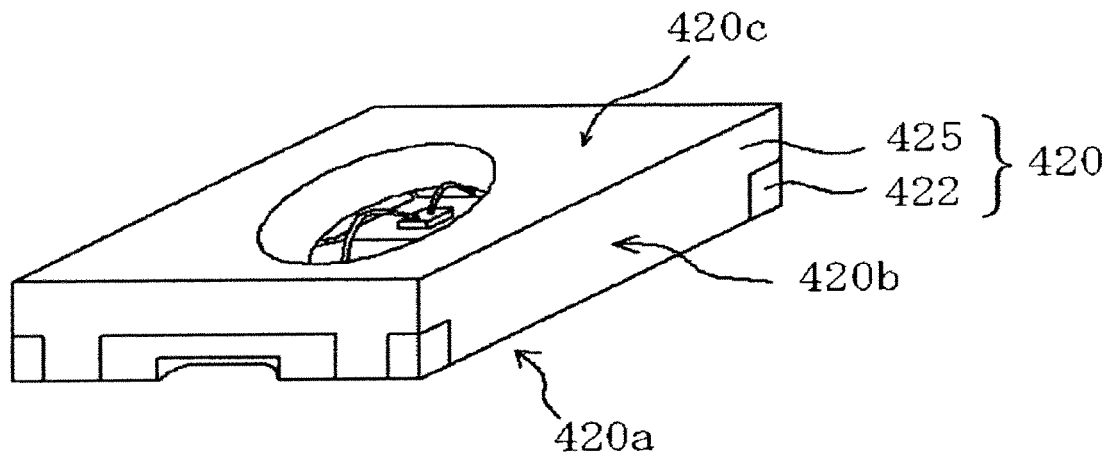
FIG. 12 is a perspective view illustrating a light emitting device according to a fifth embodiment.

A light emitting device according to a fifth embodiment will be described. FIG. 12 is a perspective view illustrating the light emitting device according to the fifth embodiment. Description of some configurations employing the substantially same configuration as the light emitting device according to the first embodiment will be omitted where necessary.

The light emitting device according to the fifth embodiment has differences in level which are dented in the portions of outer side surfaces 420b, in the leads 422 of the outer side surfaces 420b of the resin package 420. In the lead 422 which is exposed from the resin package 420, the step is formed with a first surface which is provided in the outer bottom surface 420a of the resin package 420, a second surface which is formed at a substantially right angle from the outer bottom surface 420a in an upward direction, a third surface which is formed at a substantially right angle from the second surface in the direction of the outer side surface of the resin package 420, and a fourth surface of the resin package 420. In the outer side surface 420b of the resin package 420, the leads 422 are separated into six. The leads 422 may be separated respectively, or jointed. The leads 422 provided with notch parts are more preferable than the leads of a fglate plate shape because a bonding strength between the resin part 425 and leads 422 becomes high. The outer upper surface 420c of the resin package 420 is formed in a generally rectangular shape formed with the resin part 425. Plating processing is applied to the outer bottom surface 420a, first surface, second surface provided with the step, the third surface and the inner bottom surface of the concave part. By contrast with this, plating processing is not applied to the outer side surfaces 420b provided with no step.

By providing the differences in level in part of the leads 422, it is possible to expand a bonding area with a conductive member, and increase the bonding strength. Further, a concavity is provided in the lead frame, so that it is easy to cut the lead frame and it is possible to reduce the time required for cutting.

Sixth Embodiment

Figure 13:
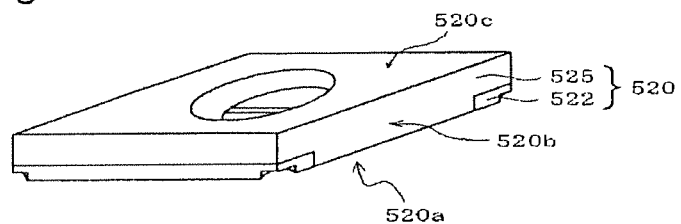
FIG. 13 is a perspective view illustrating a resin package according to a sixth embodiment.
Figure 14:
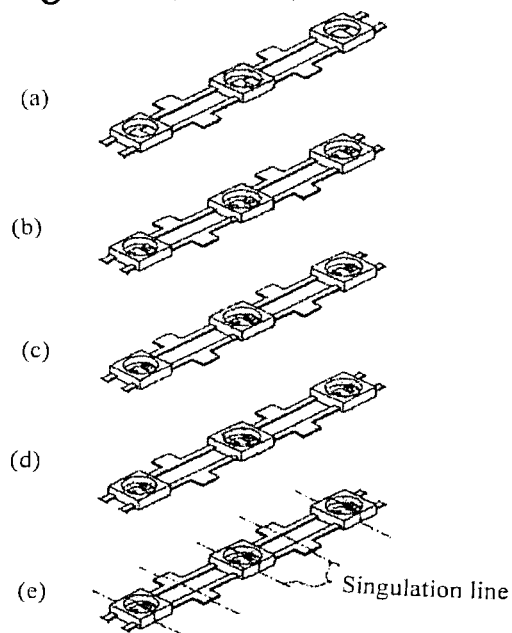
FIG. 14 is a perspective view illustrating a method for manufacturing a conventional light emitting device.
Figure 15:
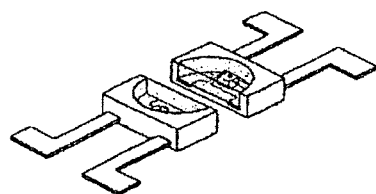
FIG. 15 is a perspective view illustrating an intermediate of a conventional light emitting device.
Figure 16:
FIG. 16 is a perspective view illustrating a conventional light emitting device.
Figure 17:
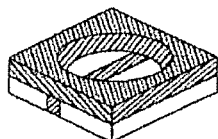
FIG. 17 is a perspective view and a sectional view illustrating a conventional light emitting device.
Figure 17:
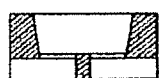
Figure 18:
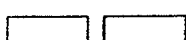
FIG. 18 is a schematic sectional view illustrating a method for manufacturing a conventional light emitting device.
Figure 18:
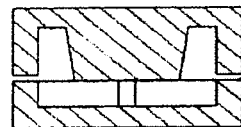
Figure 18:
Figure 19:
FIG. 19 is a schematic diagram illustrating steps of manufacturing a conventional light emitting device.
Figure 19:
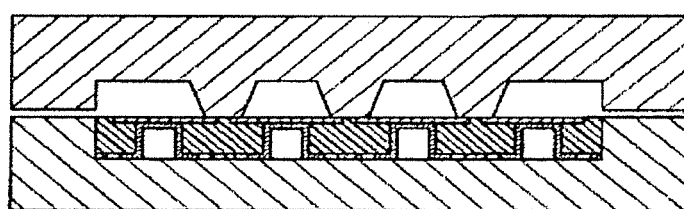
Figure 19:
Figure 19:
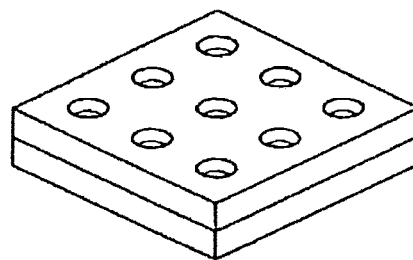

A resin package according to a sixth embodiment will be described. FIG. 13 is a perspective view illustrating the resin package according to the sixth embodiment. Description of some configurations employing the same configuration as the resin package according to the first embodiment and the resin package according to the fifth embodiment will be omitted where necessary.

The resin package according to the sixth embodiment has differences in level dented in the corner parts in the leads 522 of the outer side surfaces 520b of the resin package 520. This step has an arc shape seen from the outer bottom surface 520a side in the lead 522 exposed from the resin package 520. This arc shape is obtained by dividing a circle into four. This arc shape is obtained by etching the circle to substantially half the thickness of the circle so as not to penetrate the lead 522, and then cutting the circle into four. Plating processing is applied to the parts of these arc shapes. Plating processing is applied to these arc shape parts and outer bottom surface 520a before the circle is divided into four. By contrast with this, plating processing is not applied to the outer side surfaces 520b provided with no the step. The resin package 520 forms a generally square shape seen from the outer upper surface 520c, from which the resin part 525 is exposed.

By providing the differences in level in the leads 522, it is possible to expand a bonding area with a conductive material, and increase the bonding strength. Further, even when burrs are produced in parts of the differences in level when the resin-molded body is cut, the burrs are provided above the outer bottom surface 520a, so that the resin-molded body does not teeter when the resin-molded body is jointed with a conductive material. Further, concavities are provided in the lead frame, so that it is easy to cut the resin frame and it is possible to reduce the time required for cutting.

Example

The light emitting device according to Example 1 will be described. Overlapping description of the light emitting device described in the first embodiment will be omitted where necessary. FIG. 1 is a perspective view illustrating the light emitting device according to the first embodiment. FIG. 2 is a sectional view illustrating the light emitting device according to the first embodiment. FIG. 2 is a sectional view taken along line II-II illustrated in FIG. 1. FIG. 3 is a plan view illustrating the lead frame used in the first embodiment.

The light emitting device 100 has the light emitting element 10, and the resin package 20 in which the resin part 25 containing the light reflecting material 26 and the leads 22 are integrally molded. The light emitting element 10 is a nitride semiconductor light emitting element which emits blue light with the light emission peak wavelength at 450 nm. The resin package 20 has a generally rectangular parallelepiped shape having a mortar-shaped concave part 27. The size of the resin package 20 is 35 mm long, 35 mm wide and 0.8 mm high, and a substantially diameter on the outer upper surface 20c side of the concave part 27 is 2.9 mm, a substantially diameter of the inner bottom surface 27a is 2.6 mm and the depth is 0.6 mm. The thickness of the lead 22 is 0.2 mm. Titanium oxide is used for the light reflecting material 26. An epoxy resin which is a thermosetting resin is used for the resin part 25. The epoxy resin contains about 20% by weight of titanium oxide. The resin package 20 provides the optical reflectivity of 81% at the wavelength of 450 nm after thermal curing. The resin part 25 and leads 22 are formed in the substantially same plane in the outer side surfaces 20b of the resin package 20. The leads 22 are exposed from the four corners of the resin package 20. With the leads 22, plating processing is applied to the outer bottom surface 20a of the resin package 20 and the inner bottom surface 27a of the concave part 27. By contrast with this, with the leads 22, plating processing is not applied to the outer side surfaces 20b of the resin package 20. The sealing member 30 containing the fluorescent material 40 which emits yellow light is filled in the concave part 27. $(Y,Gd)_3(Al,Ga)_5O_{12}$:Ce is used for the fluorescent material 40. A silicone resin is used for the sealing member 30.

This light emitting device is manufactured as follows.

The lead frame is provided with the notch parts 21a by etching. Although not illustrated, a concavity and convexity are formed in the cross-sectional surface of the notch part 21a. Ag is adhered to the lead frame by electrolytic plating. The plated lead frame 21 provided with the notch parts 21a is used.

Next, the lead frame 21 of a predetermined size is sandwiched by the upper mole 61 and lower mold 62. The lead frame 21 has a flat plate shape, and is provided with the notch parts 21a matching the size of the light emitting device to be singulated. The notch parts 21a are provided in the vertical direction and horizontal direction such that, when the resin package 20 is singulated, the four corners are exposed and the parts other than the four corners are not exposed. Further, the notch parts 21a are provided in the horizontal direction such that, when the resin package 20 is singulated, the notch parts 21a are electrically insulated, and are sandwiched by the upper mold 61 and lower mold 62.

The thermosetting resin 23 containing the light reflecting material 26 is transfer-molded in the mold 60 sandwiched by the upper mold 61 and lower mold 62 to form the resin-molded body 24 in the lead frame 21. The thermosetting resin 23 containing the light reflecting material 26 is processed to a pellet, and heated and pressured to poured in the mold 60. At this time, the thermosetting resin 23 is also filled in the notch parts 21a. After temporarily curing the thermosetting resin 23 which has poured, the upper mold 61 is removed and the thermosetting resin 23 is further heated and finally cured. By this means, the resin-molded body 24 in which the lead frame 21 and thermosetting resin 23 are integrally molded is manufactured.

Next, the light emitting element 10 is mounted on the leads 22 of the inner bottom surface 27a of the concave part 27 using a die bond member. After the light emitting element 10 is placed, the light emitting element 10 and the leads 22 are electrically connected using the wires 50. Next, the sealing member 30 containing the fluorescent material 40 is filled in the concave part 27.

Finally, the resin-molded body 24 and lead frame 21 are cut along the notch parts 21a and singulated into individual light emitting devices 100. By this means, plating processing is not applied to the cut parts of the leads 22.

By performing the above steps, it is possible to manufacture multiple light emitting devices 100 at one time.

The present invention can be utilized for light equipment, a display, backlight of a mobile telephone, a movie lighting auxiliary light source and other general consumer light sources.

The invention claimed is:

1. A method of manufacturing a plurality of light emitting devices, each comprising a resin package that comprises a first lead, a second lead, and a resin part formed integrally with the first lead and the second lead, the resin package defining a concave portion, and a light emitting element located in the concave portion, wherein each resin package has a rectangular outer shape as viewed from an upper side of the light emitting device and includes: a first outer side surface, a second outer side surface opposing the first outer side surface, a third outer side surface, a fourth outer side surface opposing the third outer side surface, and an outer bottom surface at which the first lead and the second lead are exposed from the resin part, the method comprising:
   providing a structure comprising:
     a lead frame including first portions to become the first leads, and second portions to become the second leads, and
     a resin-molded body,
     wherein the structure includes a plurality of areas, each of which will become one of the resin packages, and each of which has a first outer side corresponding to the first outer side surface of the corresponding resin package, a second outer side opposing the first outer side and corresponding to the second outer side surface of the corresponding resin package, a third outer side corresponding to the third outer side surface of the corresponding resin package, and a fourth outer side opposing the third outer side and corresponding to the fourth outer side surface of the corresponding resin package,
     wherein the structure includes a plurality of concave portions on its upper side, each concave portion being defined by an inner side surface of the resin-molded body and an inner bottom surface at which a part of the first portion and a part of the second portion of the lead frame are exposed from the resin-molded body,
     wherein the lead frame has a plurality of notch parts penetrating the lead frame in up and down direction, in which a portion of the resin-molded body is disposed,
     wherein the plurality of the notch parts includes first notch parts and second notch parts,
     wherein, in each area, a respective one of the first notch parts is located between said first portion to become the first lead and said second portion to become the second lead, and extends from the first outer side of said area to the second outer side of said area, and
     wherein, in each area, at least one of the second notch parts is located at each of the third and the fourth outer sides of said area;
   mounting light emitting elements in the concave portions; and
   cutting said structure in which the light emitting elements are mounted so as to expose the portion of the resin-molded body disposed in the plurality of notch parts, to thereby obtain a plurality of light emitting devices,
   wherein, in each of the light emitting devices:
     the first lead is exposed at each of the first outer side surface, the second outer side surface and the third outer side surface,
     the second lead is exposed at each of the first outer side surface, the second outer side surface and the fourth outer side surface,
     the first lead, a portion of the resin part located above the first lead, and a portion of the resin part located lateral to the first lead are substantially coplanar with each other at the third outer side surface, and
     the second lead, a portion of the resin part located above the second lead, and a portion of the resin part located lateral to the second lead are substantially coplanar with each other at the fourth outer side surface.

2. The method of manufacturing a plurality of light emitting devices according to claim 1,
   wherein, after cutting said structure, in each of the light emitting devices:
     the first lead, the second lead, the portion of the resin part located above the first lead, the portion of the resin part located above the second lead, and at least a portion of the resin part located lateral to the first and second leads are substantially coplanar with each other at the first outer side surface, and
     the first lead, the second lead, a portion of the resin part located above the first lead, a portion of the resin part located above the second lead, and at least a portion of the resin part located lateral to the first and second leads are substantially coplanar with each other at the second outer side surface.

3. The method of manufacturing a plurality of light emitting devices according to claim 1, wherein each of the light emitting elements is mounted on at least one of the first portion to become the first lead or the second portion to become the second lead that is exposed from the resin-molded body at the inner bottom surface of the concave portion.

4. The method of manufacturing a plurality of light emitting devices according to claim 1, wherein the lead frame includes a silver plating at least at an entire upper surface thereof.

5. The method of manufacturing a plurality of light emitting devices according to claim 1, wherein the lead frame includes a silver plating over an entire upper surface thereof, an entire lower surface thereof, and entire side surfaces thereof inside the plurality of notch parts.

6. The method of manufacturing a plurality of light emitting devices according to claim 1, wherein the lead frame includes a difference in level or a concave-convex shape formed at a cross section thereof.

7. The method of manufacturing a plurality of light emitting devices according to claim 1, further comprising:
mounting protective elements in the concave portions, wherein each of the protective elements is mounted on at least one of the first portion of the lead frame to become the first lead or the second portion of the lead frame to become the second lead that is exposed from the resin-molded body at the inner bottom surface of the concave portion.

8. The method of manufacturing a plurality of light emitting devices according to claim 1,
wherein, in providing said structure, in each area:
a width of each first notch part at the first outer side is wider than a width of the first notch part at the inner bottom surface of the concave portion in a direction along the first outer side as viewed from the upper side of said area, and
a width of each first notch part at the second outer side is wider than a width of the first notch part at the inner bottom surface of the concave portion in a direction along the second outer side as viewed from the upper side of said area.

9. The method of manufacturing a plurality of light emitting devices according to claim 8, wherein the lead frame includes a silver plating at least at an entire upper surface thereof.

10. The method of manufacturing a plurality of light emitting devices according to claim 8, wherein the lead frame includes a silver plating at an entire upper surface thereof, an entire lower surface thereof, and entire side surfaces thereof inside the plurality of notch parts.

11. The method of manufacturing a plurality of light emitting devices according to claim 8, wherein, in each area, in a plan view, the plurality of notch parts extend over at least half of a surrounding periphery of said area.

12. The method of manufacturing a plurality of light emitting devices according to claim 11, wherein, in each area, a bottom surface of the first portion to become the first lead, a bottom surface of the second portion to become the second lead, a bottom surface of the portion of the resin-molded body disposed in the first notch parts and a bottom surface of the portion of the resin-molded body disposed in the second notch parts are substantially coplanar at a bottom surface of the structure.

13. The method of manufacturing a plurality of light emitting devices according to claim 1, wherein, in each area, in a plan view, the plurality of notch parts extend over at least half of a surrounding periphery of said area.

14. The method of manufacturing a plurality of light emitting devices according to claim 13, wherein, in each area, a bottom surface of the first portion to become the first lead, a bottom surface of the second portion to become the second lead, a bottom surface of the portion of the resin-molded body disposed in the first notch parts and a bottom surface of the portion of the resin-molded body disposed in the second notch parts are substantially coplanar at a bottom surface of the structure.

15. The method of manufacturing a plurality of light emitting devices according to claim 1, wherein the resin-molded body comprises a thermosetting resin.

16. The method of manufacturing a plurality of light emitting devices according to claim 15, wherein the thermosetting resin is a triazine derivative epoxy resin.

17. The method of manufacturing a plurality of light emitting devices according to claim 1, wherein the resin-molded body contains a light reflecting material.

18. The method of manufacturing a plurality of light emitting devices according to claim 17, wherein the light reflecting material is titanium oxide.

19. The method of manufacturing a plurality of light emitting devices according to claim 1, further comprising:
arranging sealing members in the concave portions in which the light emitting elements are mounted.

20. The method of manufacturing a plurality of light emitting devices according to claim 19, wherein the sealing members comprise a silicone resin or a modified silicone resin.

21. The method of manufacturing a plurality of light emitting devices according to claim 19, wherein each of the sealing members contains two or more fluorescent materials.

* * * * *